United States Patent
Chen et al.

(10) Patent No.: US 9,136,852 B2
(45) Date of Patent: Sep. 15, 2015

(54) MULTI-STAGE PARALLEL SUPER-HIGH-SPEED ADC AND DAC OF LOGARITHMIC COMPANDING LAW

(71) Applicants: Qixing Chen, Hunan (CN); Qiyu Luo, Beijing (CN)

(72) Inventors: Qixing Chen, Hunan (CN); Qiyu Luo, Beijing (CN)

( * ) Notice: Subject to any disclaimer, the term of this patent is extended or adjusted under 35 U.S.C. 154(b) by 0 days.

(21) Appl. No.: 14/366,254

(22) PCT Filed: Feb. 22, 2013

(86) PCT No.: PCT/CN2013/000173
§ 371 (c)(1),
(2) Date: Oct. 21, 2014

(87) PCT Pub. No.: WO2013/097831
PCT Pub. Date: Jul. 4, 2013

(65) Prior Publication Data
US 2015/0035689 A1 Feb. 5, 2015

(30) Foreign Application Priority Data

Dec. 26, 2011 (CN) .......................... 2011 1 0440575
May 30, 2012 (CN) .......................... 2012 1 0185940
Feb. 7, 2013 (CN) .......................... 2013 1 0048568

(51) Int. Cl.
*H03M 1/00* (2006.01)
*H03M 1/16* (2006.01)
(Continued)

(52) U.S. Cl.
CPC .............. *H03M 1/001* (2013.01); *H03M 1/167* (2013.01); *H03M 1/682* (2013.01); *H03M 1/765* (2013.01)

(58) Field of Classification Search
CPC .......... H03M 1/00; H03M 1/02; H03M 1/001
USPC .................. 341/155, 110, 156, 144, 100, 101
See application file for complete search history.

(56) References Cited

U.S. PATENT DOCUMENTS 4,746,901 A * 5/1988 Smith ........................... 341/156
4,875,048 A * 10/1989 Shimizu et al. ............... 341/156
(Continued)

FOREIGN PATENT DOCUMENTS

| CN | 1294325 | 5/2001 |
| CN | 1487672 | 4/2004 |
| CN | 1523765 | 8/2004 |

(Continued)

OTHER PUBLICATIONS

Chen Qixing, Luo Qiyu, Chen Ye, Replacement Type DAC/ADC and Realizing Method for Logarithm Compression Ratio, Journal of Data Acquisition & Processing, Jan. 2007, p. 115-120, 22-1, ISSN 1004-9037, CODEN SCYCE4, China.

(Continued)

*Primary Examiner* — Jean B Jeanglaude

(57) ABSTRACT

Multi-stage parallel super-high-speed ADC and DAC of a logarithmic companding law has a voltage follower switch having zero voltage drop, and also has a lossless threshold switch group, wherein a quantization voltage of A/D conversion or D/A conversion is directly obtained through voltage-dividing resistance thereof. The ADC and DAC simplify a conversion process and reduce a conversion error. The ADC and DAC provide multi-stage multi-bit parallel super-high-speed A/D conversion and D/A conversion with logarithmic companding law of a high conversion rate and the low conversion error.

10 Claims, 19 Drawing Sheets

(51) Int. Cl.
*H03M 1/68* (2006.01)
*H03M 1/76* (2006.01)

(56) References Cited

U.S. PATENT DOCUMENTS 5,243,333 A    9/1993   Shiba et al.
6,366,065 B1 *  4/2002   Morita ........................ 323/280

FOREIGN PATENT DOCUMENTS

| CN | 1567726   | 1/2005 |
| CN | 101145783 | 3/2008 |
| CN | 1567726   | 4/2010 |
| CN | 101989858 | 3/2011 |
| CN | 103138757 | 6/2013 |
| CN | 103490778 | 1/2014 |
| CN | 103516363 | 1/2014 |

OTHER PUBLICATIONS

Chen Qixing, Luo Qiyu, Research on a method of combine grade replacement of flash A/D converter, Computer and Information Technology, Feb. 2005, 13-1, China.

Luo Qiyu, Chen Bin, Chen Qixing, A Weight Voltage DAC been Chained by Weight Resistance, Computer and Information Technology, Aug. 2011, 19-4, China.

* cited by examiner

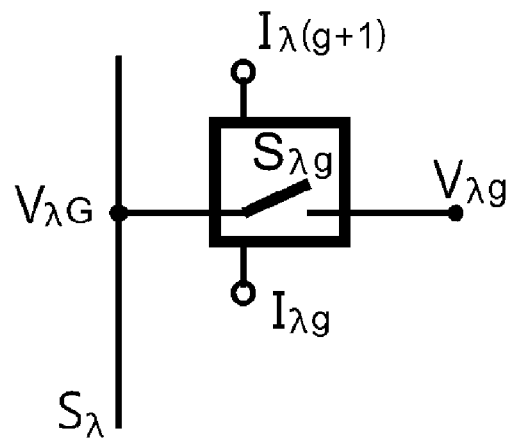
Fig. 1.1
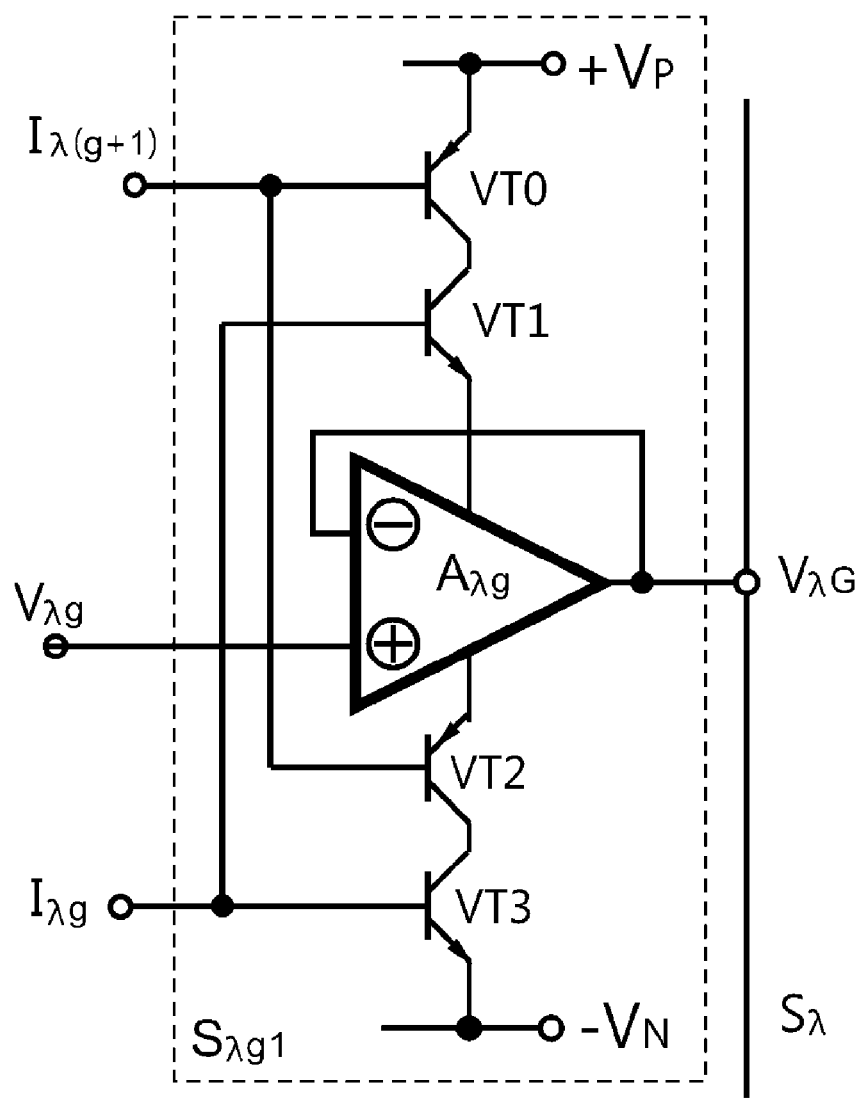
Fig. 1.2.1

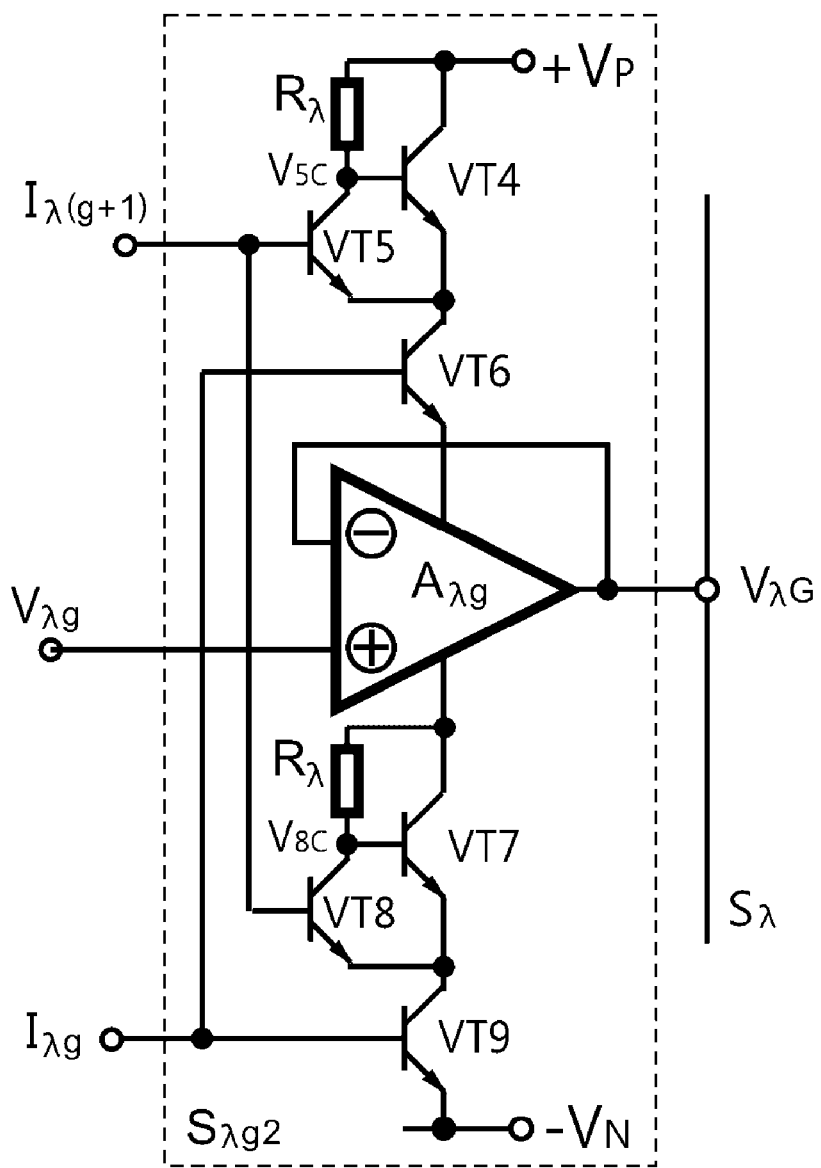
Fig. 1.2.2

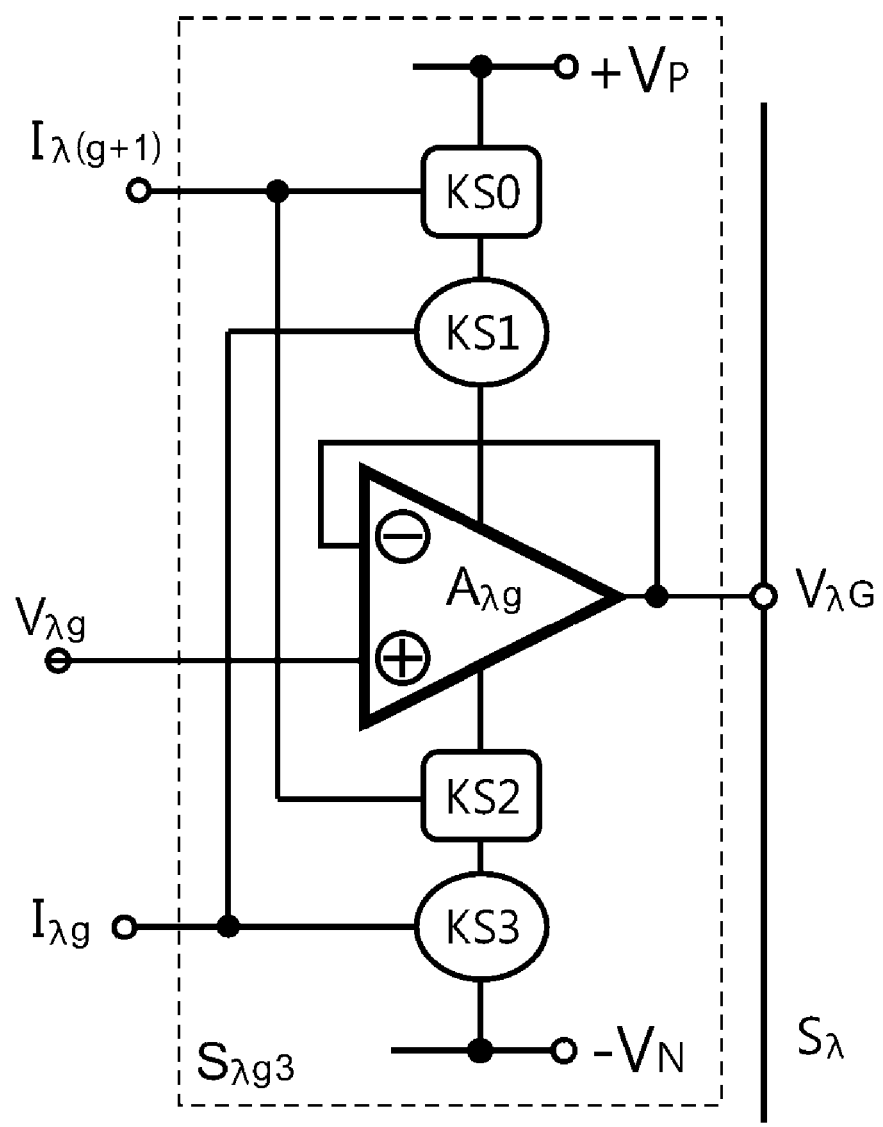
Fig. 1.2.3

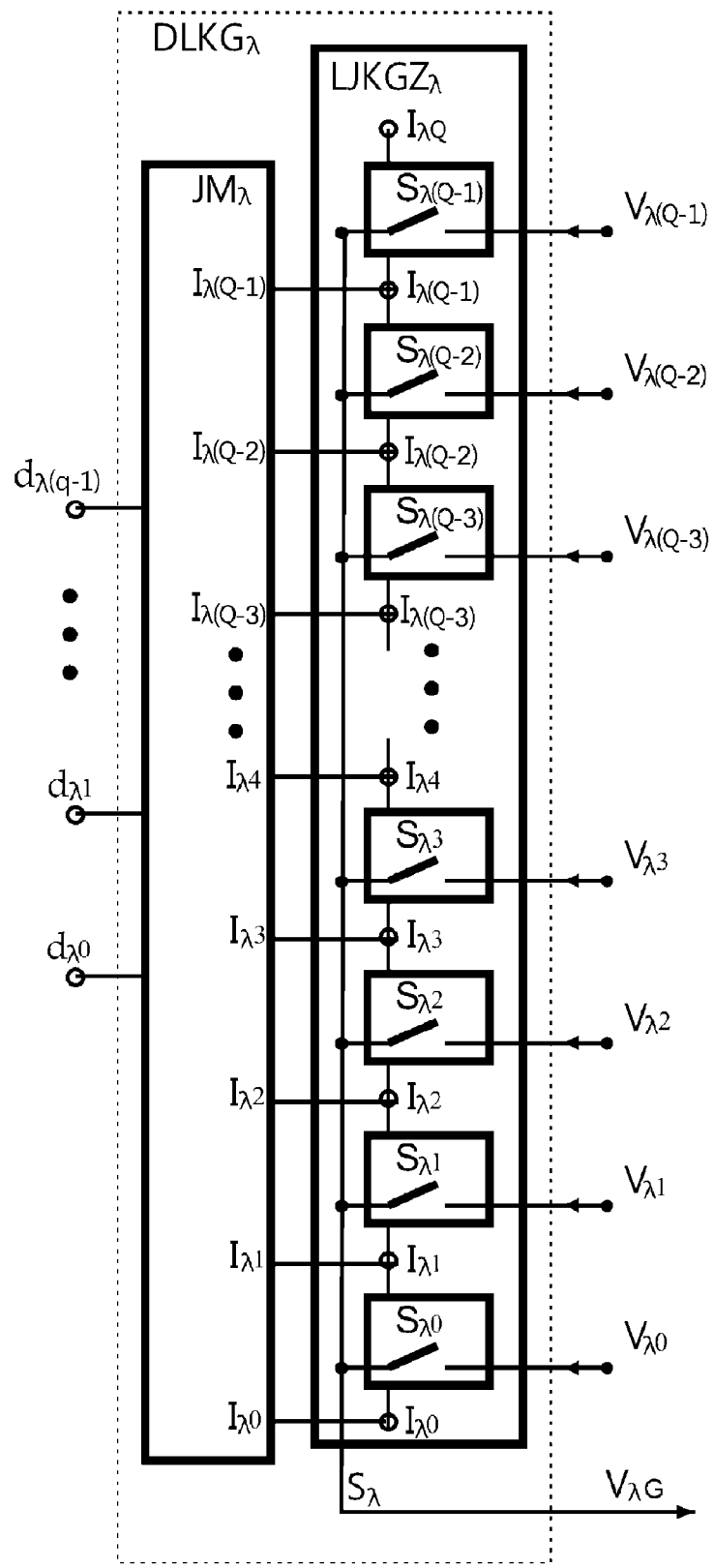
Fig. 1.2.4

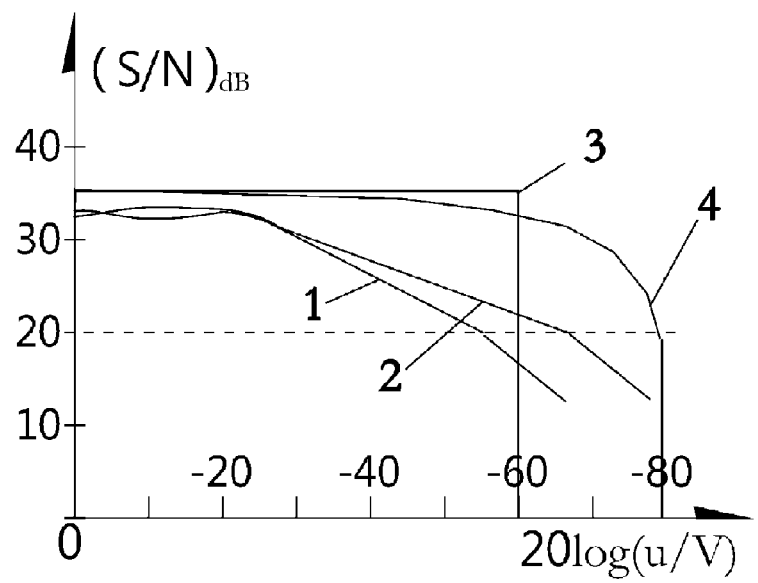
Fig. 1.3
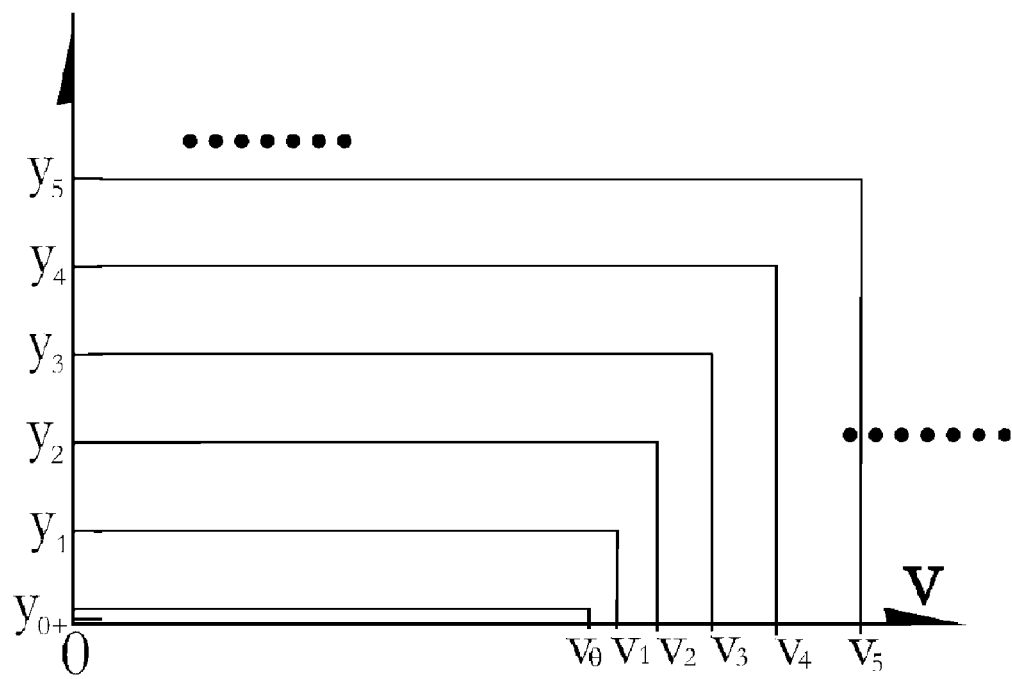
Fig. 1.5

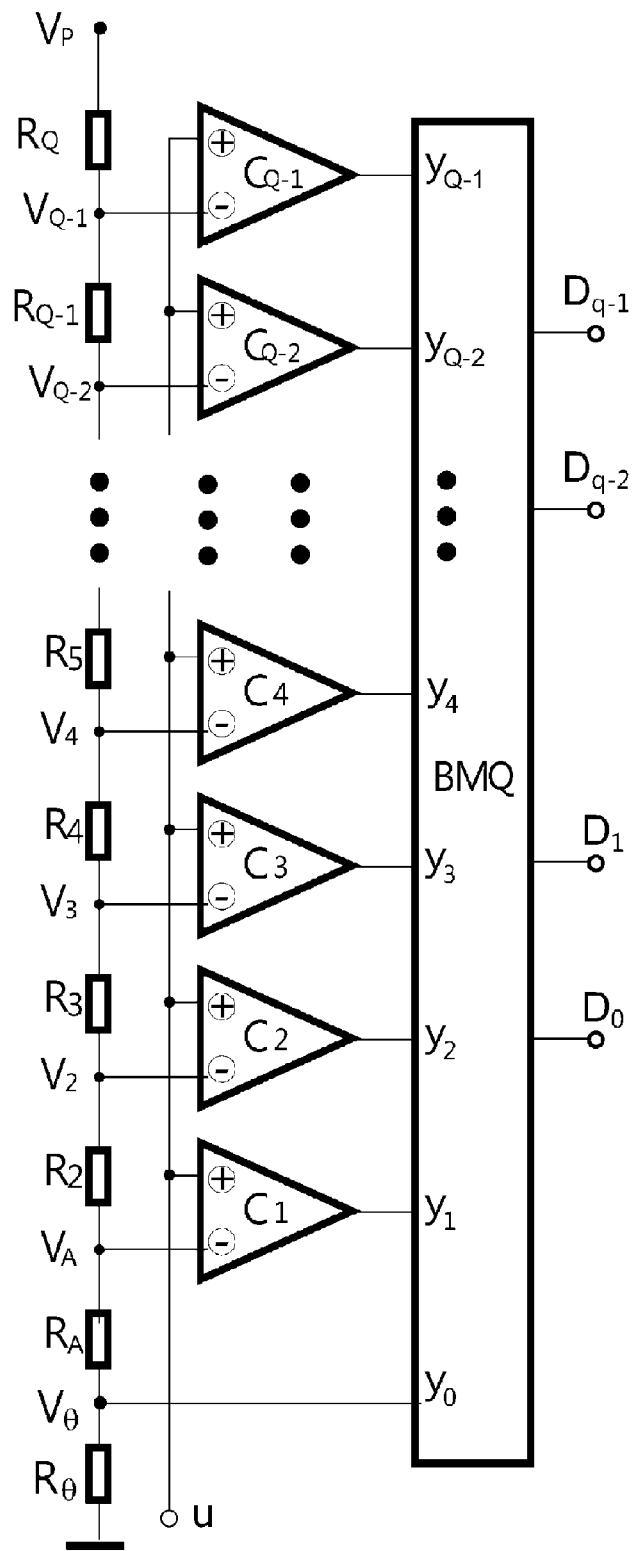
Fig. 1.4

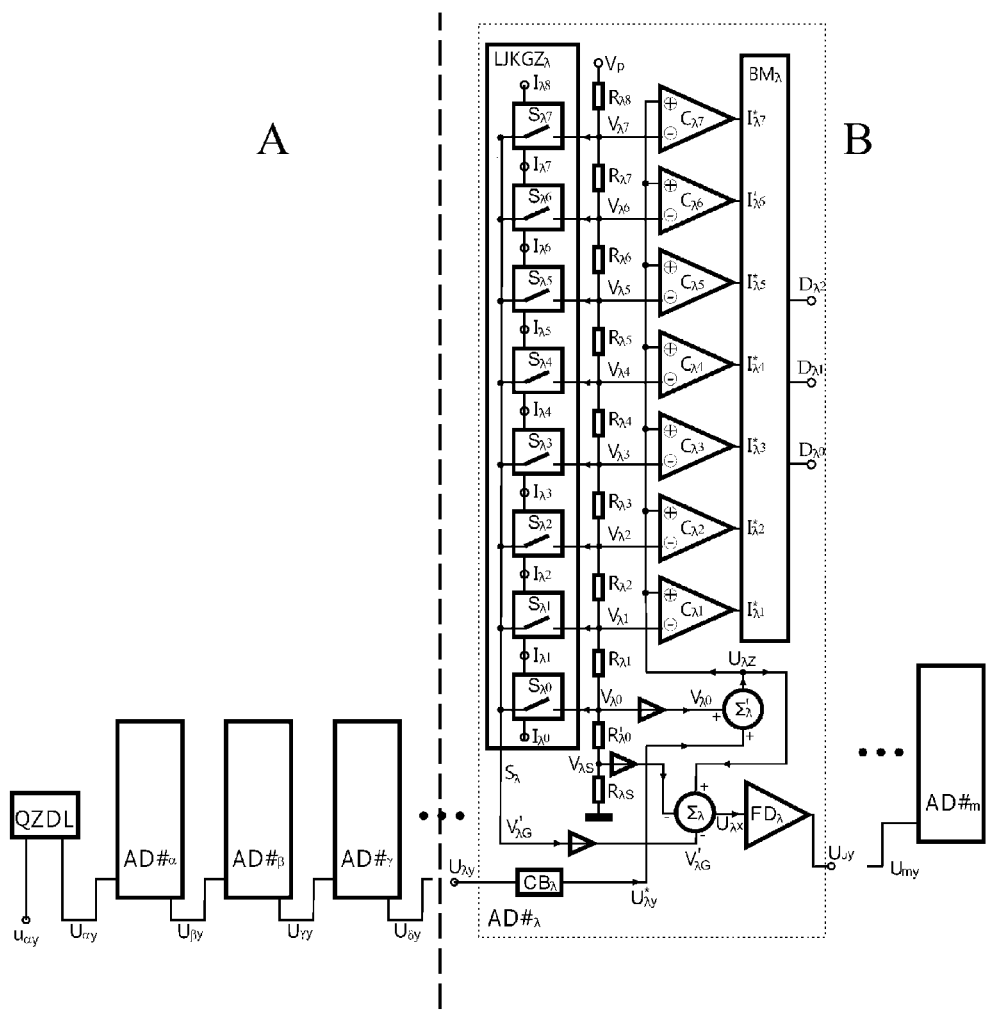
Fig. 2.1
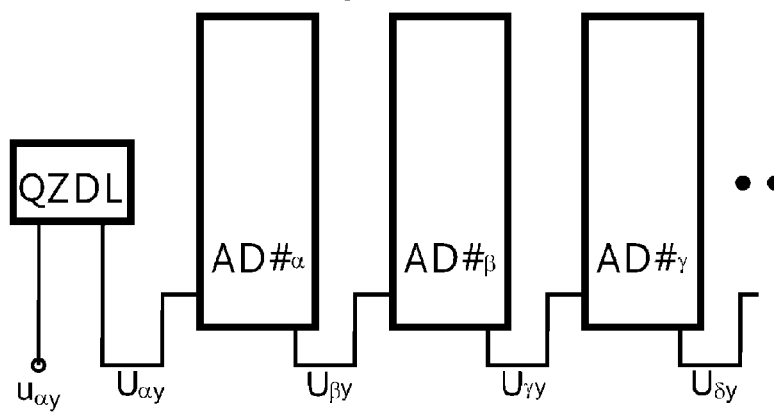
Fig. 2.1A

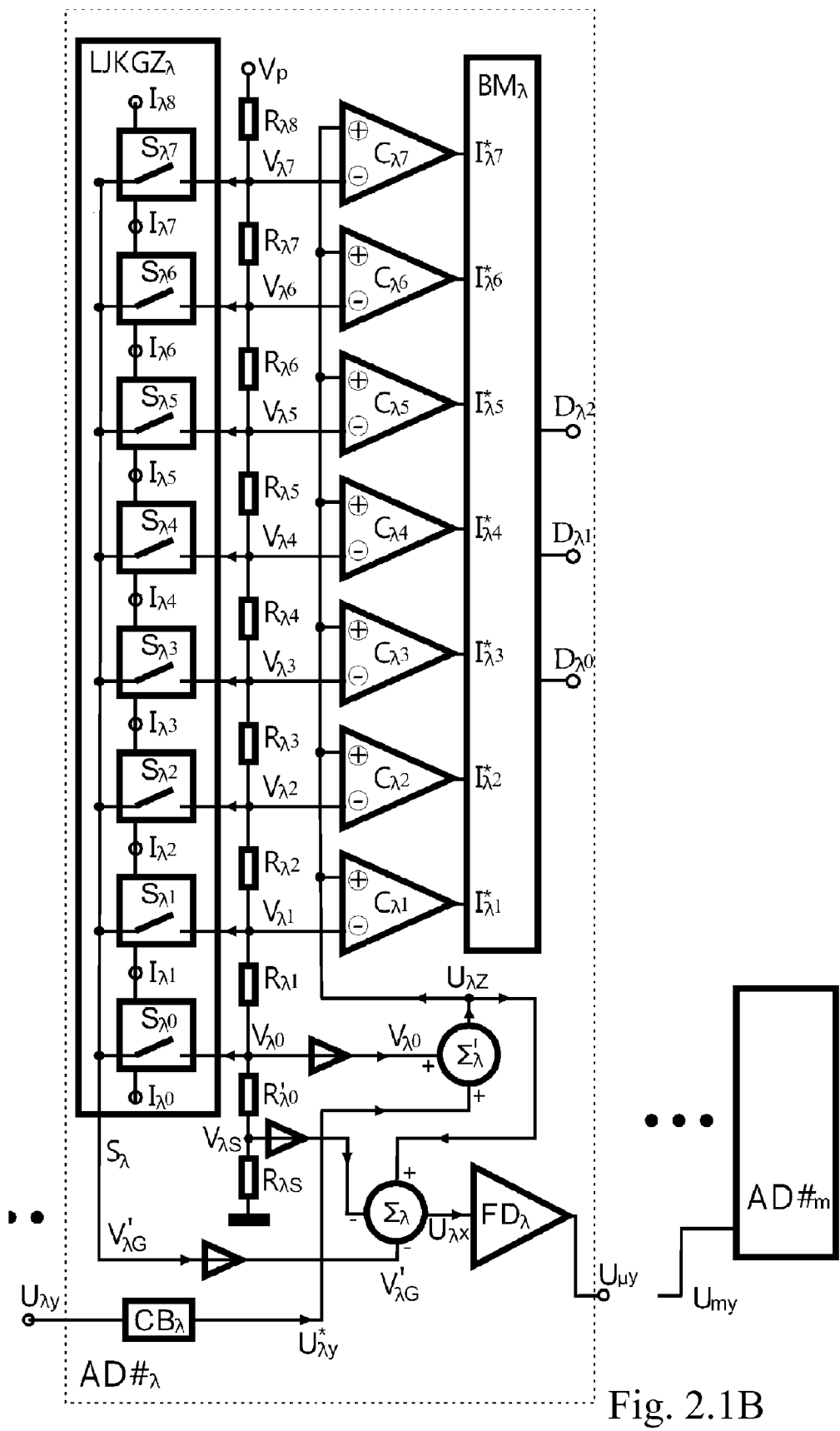
Fig. 2.1B

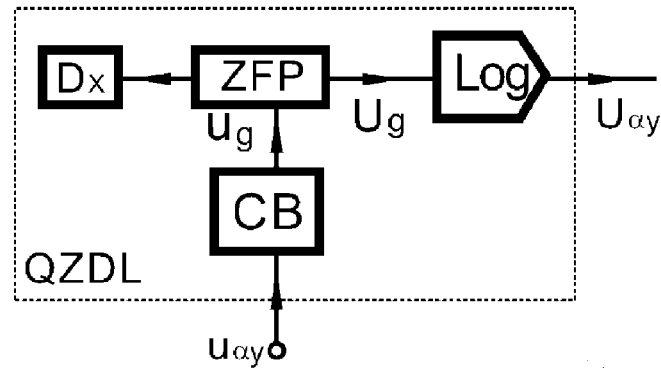
Fig. 2.2
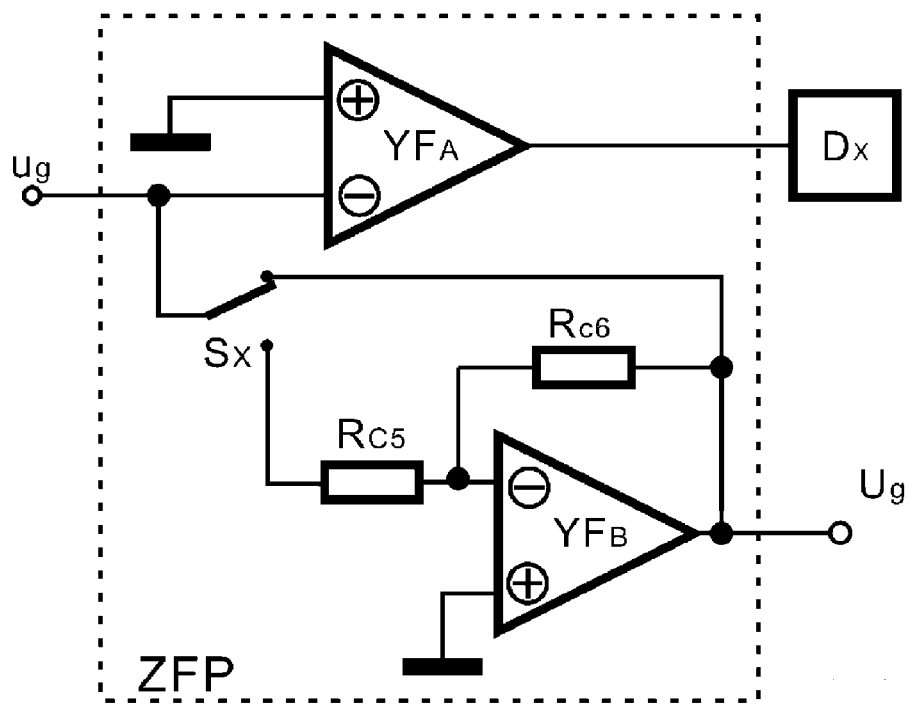
Fig. 2.3

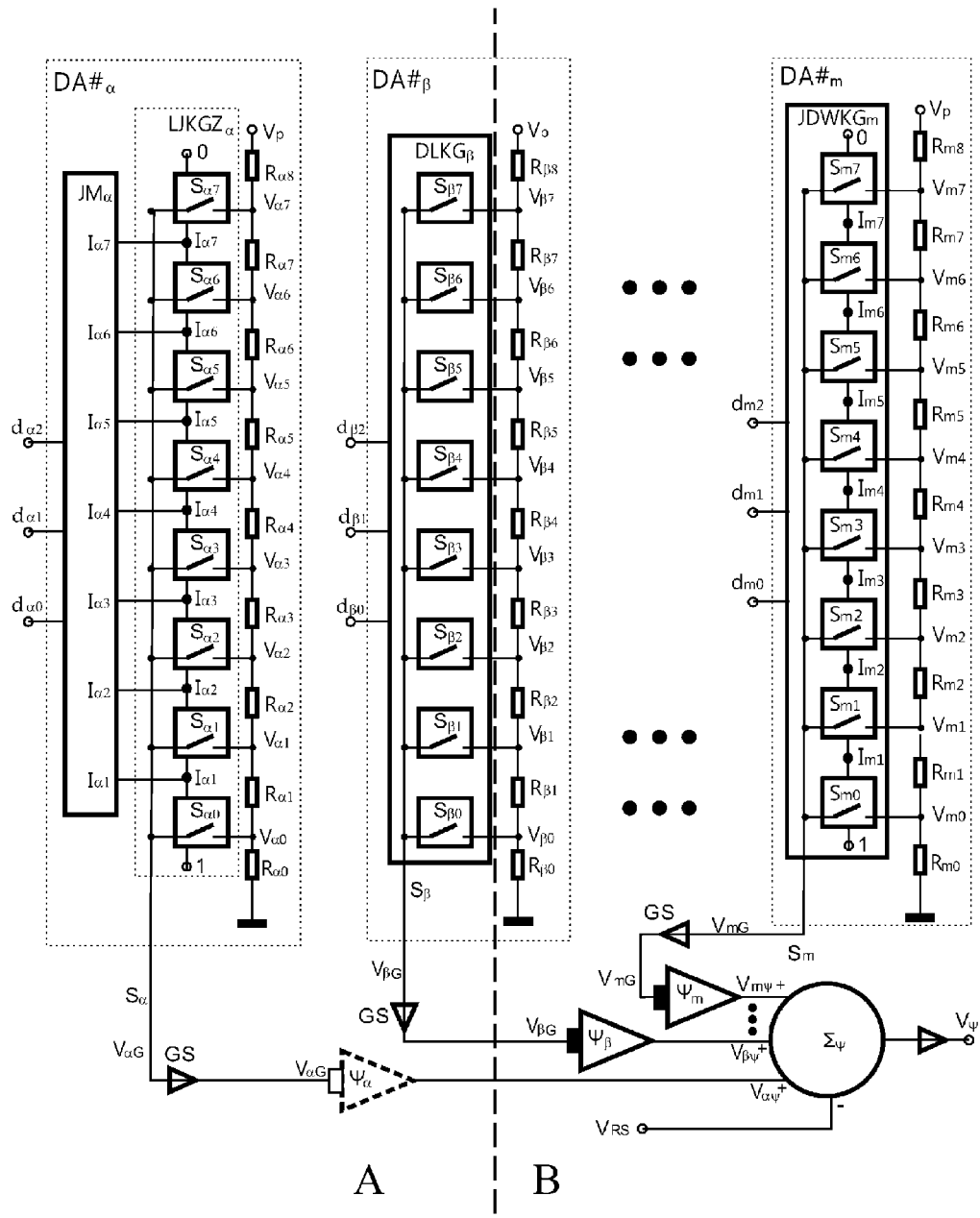
Fig. 3.1

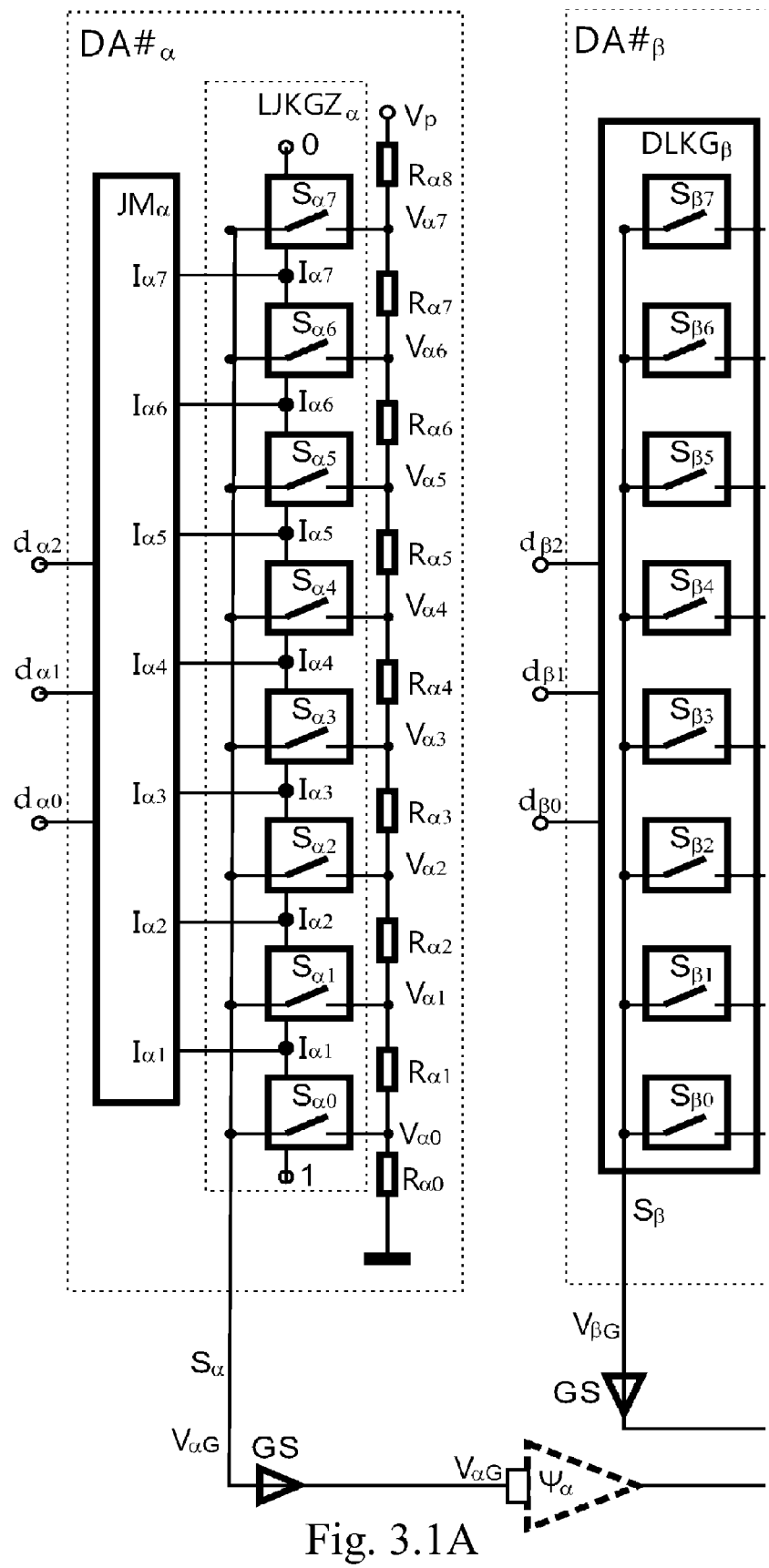
Fig. 3.1A

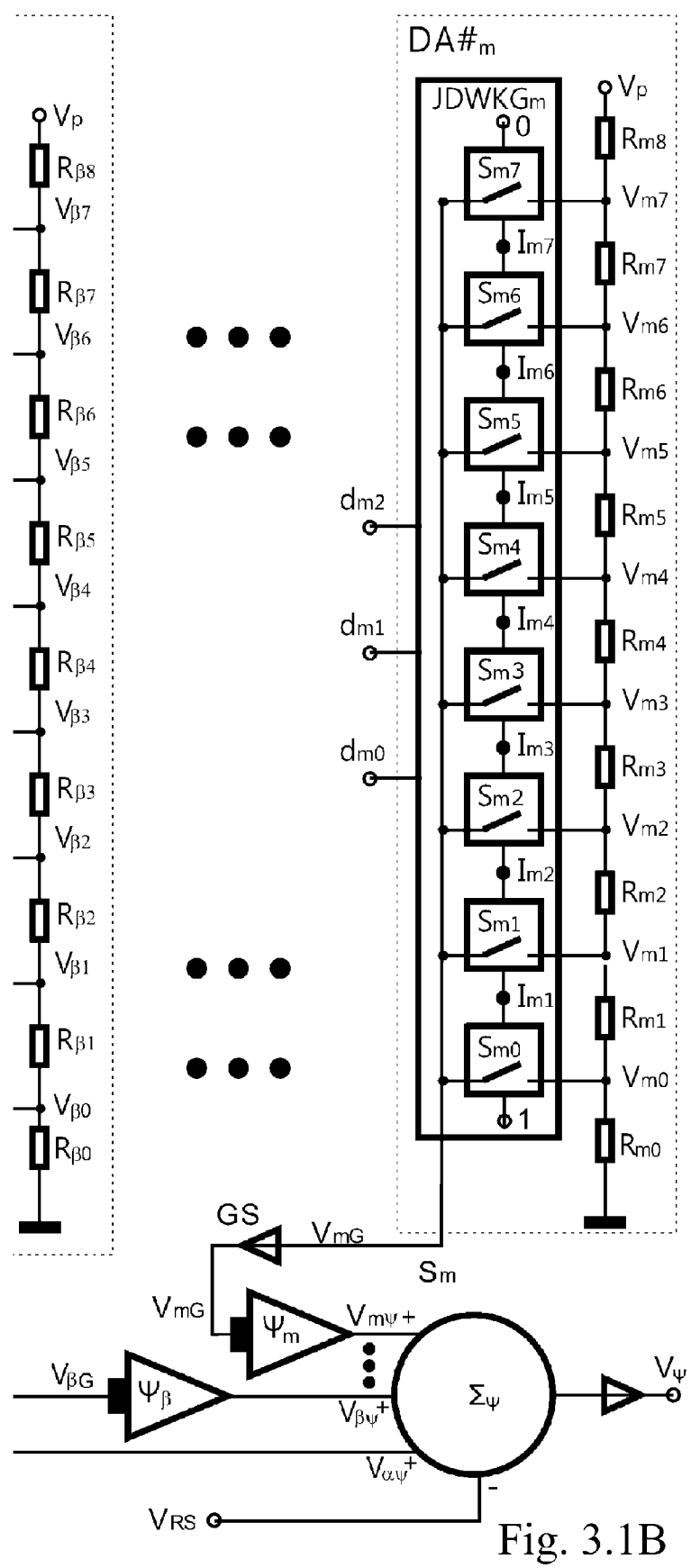
Fig. 3.1B

Fig. 3.2.1
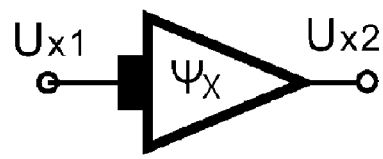
Fig. 3.2.2
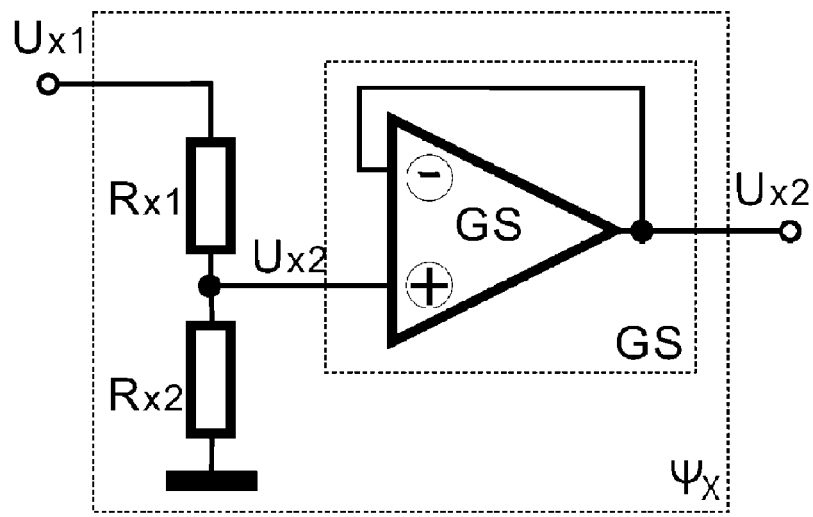
Fig. 3.2.3

MULTI-STAGE PARALLEL SUPER-HIGH-SPEED ADC AND DAC OF LOGARITHMIC COMPANDING LAW

CROSS REFERENCE OF RELATED APPLICATION

This is a U.S. National Stage under 35 U.S.C 371 of the International Application PCT/CN2013/000173, filed Feb. 22, 2013, which claims priority under 35 U.S.C. 119(a-d) to CN 201110440575.1, filed Dec. 26, 2011; CN 201210185940.3, filed May 30, 2012; and CN 201310048568.6, filed Feb. 7, 2013.

BACKGROUND OF THE PRESENT INVENTION

1. Field of Invention

The present invention relates to digital communications, and more particularly to an Analog-to-Digital Converter (ADC) and a Digital-to-Analog Converter (DAC).

2. Description of Related Arts

According to the theoretical analysis, for the communications system, the logarithmic compression law is most ideal but difficult to realize. Conventionally, the communications system employs the companding codes. For example, the audio communications employs the 8-bit companding codes of the A-compression-law and the μ-compression-law whose signal-to-noise ratio (SNR) curves are respectively showed as 1 and 2 in FIG. 1.3, wherein the SNR curves thereof are only approximations to the logarithmic compression law, not ideal SNR curves. Then what shape is the ideal SNR curve supposed to have? The ideal SNR curve satisfies that the SNR does not change with the analog input signal amplitude and the probability density distribution; in other words, the ideal SNR curve is supposed to be a horizontal line 3 as a constant. Furthermore, the ideal SNR curve is supposed to move up and extend right as much as possible, wherein moving the curve up means increasing the SNR and extending the curve right means broadening the signal dynamic range.

Conventionally, the circuit for accomplishing the companding coding is the successive approximation ADC which is slower than the parallel ADC by two orders of magnitude. However, the conventional parallel ADC is unable to accomplish the ideal companding coding. Thus, it becomes the object of the present invention to provide a parallel ADC capable of accomplishing the logarithmic compression law and a correspondent DAC of the logarithmic expansion law.

According to the present invention, the Analog-to-Digital (AD) conversion having a constant SNR is theoretically analyzed as follows.

Firstly, a method for stabilizing an SNR of an ADC at a constant is deduced; a value of the SNR and a signal dynamic range are counted. Given that: a probability density distribution is $P(u)$; when $V_{j-1} < u \leq V_j$ ($j=1 \ldots Q$), a quantizer inputs a signal power $S_j$ and a noise power is $N_j$; $\Delta V_j = V_j - V_{j-1}$, wherein a quantizer step size of axis V, $\Delta V_j$, is a variable; $V_{j-1}$ is temporarily taken as a quantized point of u for the analysis, $$\text{signal average power of } u: S_j = \int_{V_{j-1}}^{V_j} u^2 P(u) du \quad (1.1);$$

$$\text{noise average power of } u: N_j = \int_{V_{j-1}}^{V_j} (u-V_{j-1})^2 P(u) du \quad (1.2);$$

$$\text{SNR: } S_j/N_j = \int_{V_{j-1}}^{V_j} u^2 P(u) du / [\int_{V_{j-1}}^{V_j} (u-V_{j-1})^2 P(u) du] \quad (1.3).$$

Because $V_0 \sim V_P$ is divided into Q subzones, $\Delta V_j$ is small enough and thus $P(u)$ in the interval $\Delta V_j$ is equal to a constant. Substituted with $V_j = V_{j-1} + \Delta V_j$ and $X = V_{j-1}/\Delta V_j$, the SNR is simplified as:

$$S_j/N_j = P(u)\int_{V_{j-1}}^{V_j} u^2 du / [P(u)\int_{V_{j-1}}^{V_j} (u-V_{j-1})^2 du] = (3V_{j-1}^2 * \Delta V_j + 3V_{j-1} * \Delta V_j^2 + \Delta^3 V_j)/\Delta^3 V_j = 3(X^2 + X + 1/3) = 3(X+1/2)^2 + 1/4; \quad (1.4.1)$$

$$[S_j/N_j]_{dB} = 10 \log(3(X+1/2)^2 + 1/4) \approx 10 \log 3 + 20 \log(V_{j-1}/\Delta V_j + 1/2) \quad (1.5.1)$$

If equaling $V_j/\Delta V_j$ to a constant, the value of $S_j/N_j$ becomes a constant and the object of stabilizing the SNR $[S_j/N_j]_{dB}$ at the constant is accomplished, wherein the $[S_j/N_j]_{dB}$ maintains constant in a range of $20 \log V_P/V_P \sim 20 \log V_\theta/V_P$; in other words, the dynamic range of $[S_j/N_j]_{dB}$ is $0 \sim 20 \log V_\theta/V_P$. As showed in FIG. 1.4, given that $V_\theta = u_\theta$, wherein $u_\theta$ is a minimal effective signal which a sensor is able to obtain, u is at a signal dead zone when u is at a range of $(V_\theta \sim 0)$; then let the sensor signal $u=0$ and be merged into a zone $y_0$, $S_j/N_j = 0$.

Then the quantized point is processed with a half-step quantization. In order to determine quantization resistances $R_\theta \sim R_Q$, $V_{j-1}$ is temporarily taken as the quantized point. Once $R_\theta \sim R_Q$ are determined, the quantized point is adjusted into a real quantized point $U_{j-1} = (V_{j-1} + V_j)/2$. $U_{j-1}$ is named as a half-step quantized point, and an integral interval of $N_j$ is changed and ranges from $U_{j-1} - \Delta V_j/2$ to $U_{j-1} + \Delta V_j/2$, namely the quantization step size after adjusting the quantized point becomes $\Delta U_j$, wherein $\Delta U_j = \Delta V_j/2$. With identical original data, a quantization error decreases ¾ and $[S_j/N_j]_{dB}$ increases $10 \log 4 = 6.02$ dB. Here comes the question about how to adjust the quantized point. In the AD conversion process, adjusting the quantized point complicates the circuit; moreover, information after the AD conversion becomes digital, which means it is impossible to adjust the quantized point. Thus the Digital-to-Analog (DA) conversion permits adjusting the quantized point; in other words, during the DA conversion process, the quantized point $V_{j-1}$ is adjusted into $U_{j-1} = (V_{j-1} + V_j)/2$. $\Delta U_j = \Delta V_j/2$, substituted with $V_j = V_{j-1} + \Delta V_j$ and then $X = V_{j-1}/\Delta V_j$, the SNR is simplified as:

$$S_j/N_j = P(u)\int_{U_{j-1}-\Delta U_j}^{U_{j-1}+\Delta U_j} u^2 du / [P(u)\int_{U_{j-1}-\Delta U_j}^{U_{j-1}+\Delta U_j} (u-U_{j-1})^2 du] =$$
$$[u^3|_{U_{j-1}-\Delta U_j}^{U_{j-1}+\Delta U_j}]/[(u-U_{j-1})^3|_{U_{j-1}-\Delta U_j}^{U_{j-1}+\Delta U_j}] = 3[((V_{j-1}+V_j)/2)/(\Delta V_j/2)]^2 + 1 = 3$$
$$[((2V_{j-1}+\Delta V_j)/2)/(\Delta V_j/2)]^2 + 1 = 12(X+1/2)^2 + 1 = 4[3(X+1/2)^2 + 1/4]; \quad (1.4.2)$$

$$[S_j/N_j]_{dB} = 10 \log 4(3(X+1/2)^2 + 1/4) \approx 10 \log 12 + 20 \log (V_{j-1}/\Delta V_j + 1/2) \quad (1.5.2)$$

(1.4.2) is four times of (1.4.1); (1.5.2)=(1.5.1)+10 log 4.

Secondly, how to set $V_j$ and $\Delta V_j$, i.e., how to determine the value of each quantized point $V_\theta, V_1 \ldots V_{Q-1}$, is analyzed. The value of each quantized point depends on a resistance of each resistor in a resistor chain, so a rule about how to set the resistance is simultaneously inferred.

Inference 1: If $V_j/\Delta V_j = a$ constant, the value of each quantized point $V_\theta, V_1 \ldots V_Q$ geometrically increases, namely $$V_1 = V_\theta * \eta^1, V_2 = V_\theta * \eta^2 \ldots V_{Q-1} = V_\theta * \eta^{Q-1}, V_P = V_\theta * \eta^Q; \quad (1.6)$$

Proof: Since $\Delta V_j/V_j = (V_{j+1} - V_j)/V_j = (V_{j+1}/V_j) - 1 = a$ constant (1.7)

$$V_{j+1}/V_j = \eta \text{ (}\eta \text{ is a geometric constant)} \quad (1.8)$$

Then $V_1/V_\theta = V_2/V_1 = \ldots = V_{Q-1}/V_{Q-2} = V_P/V_{Q-1} = \eta$ (1.9)

Thus $V_1, V_2 \ldots V_{Q-1}$ are respectively: $V_1 = V_\theta * \eta^1$, $V_2 = V_\theta * \eta^2 \ldots V_{Q-1} = V_\theta * \eta^{Q-1}$, $V_P = V_\theta * \eta^Q$ Consequently, Conclusion 1: if the value of each quantized point geometrically increases on the basis of potential $V_\theta$, the SNR becomes constant, which means the logarithmic law of compression and expansion are accomplished.

Inference 2 is obtained as a result of the Inference 1.

Inference 2: In order to satisfy a requirement that the value of each quantized point $V_\theta, V_1 \ldots V_Q$ geometrically increases, it must be given that $$①R_1/R_\theta = \eta - 1 \qquad (1.10);$$

$$②R_{j+1}/R_j = \eta (j=1 \ldots Q-1) \qquad (1.11);$$

wherein $R_1, R_2 \ldots R_Q$ are respectively: $R_1 = R_\theta*(\eta-1)$, $R_2 = R_1*\eta^1$, $R_3 = R_1*\eta^2 \ldots R_Q = R_1*\eta^{Q-1}$.

Deduction ①: Since $V_1 = V_\theta*\eta$, $I(R_1+R_\theta) = I*R_\theta*\eta$, then $R_1/R_\theta = \eta-1$;

Deduction ②: $R_\theta + \ldots + R_j$ is simply marked as $\Sigma R_j$; according to the equation (1.8), $V_{j+1} = V_j*\eta$, namely $I*\Sigma R_{j+1} = I*\Sigma R_j*\eta$, then $\Sigma R_{j+1} - \Sigma R_j = \Sigma R_j*\eta - \Sigma R_j$, $R_{j+1} = \Sigma R_j*(\eta-1)$, $R_{j+1}/\Sigma R_j = \eta-1$; also then $R_j/\Sigma R_{j-1} = \eta-1$; thus $R_{j+1}/R_j = \Sigma R_j/\Sigma R_{j-1} = (R_j + \Sigma R_{j-1})/\Sigma R_{j-1} = R_j/\Sigma R_{j-1} + \Sigma R_{j-1}/\Sigma R_{j-1} = (\eta-1)+1 = \eta$; Q.E.D.

Consequently, Conclusion 2: On the basis of the resistance $R_\theta$, given that $R_1/R_\eta = \eta-1$ and $R_{j+1}/R_j = \eta$, wherein $\eta$ is given a range of (1.001~1.5) in the present invention, $V_{j+1}/V_j = \eta$; the SNR becomes constant, so that the logarithmic law of compression and expansion are accomplished.

Since $V_P$ is known, once two of $V_\theta$, Q and $\eta$ are determined, the rest one can be determined via deduction. In most cases, $V_\theta$ and Q are determined firstly to compute the correspondent $\eta$, $V_1\sim V_{Q-1}$ and $R_\theta\sim R_{Q-1}$.

Conventionally, the audio communications employs the 8-bit digital signals, wherein one bit is for indicating positive or negative and other seven bits are for coding, in such a manner that $Q=2^q=128$, which requires the dynamic range to be no less than 40 dB and the SNR to be no less than 26 dB. As a design of the constant SNR according to the present invention, supposing that $V_P=10000\Delta$, wherein $\Delta$ is a uniform quantization unit, as showed in Table 1, the SNRs, $[S_j/N_j]_{dB}$, and the signal dynamic ranges of $V_\theta=10\Delta$, $V_\theta=5\Delta$, $V_\theta=2\Delta$, $V_\theta=1\Delta$ and $V_\theta=0.1\Delta$ are respectively counted according to the equation (1.5.2). Further referring to FIG. 1.5, let a basic potential equal to a potential of the signal dead zone $V_\theta$, if the weak signal zone employs a high SNR, the signal dead zone $V_\theta$ is one order of magnitude larger than the few initial quantization steps $\Delta V_1, \Delta V_2, \Delta V_3 \ldots$, which causes a waste of resource; thus it is necessary for $V_\theta$ to be at identical order of magnitude with $\Delta V_1, \Delta V_2, \Delta V_3 \ldots$ to reduce the signal dead zone, despite of a fact that the SNR within the weak signal zone decreases to some extent. Actually, within the weak signal zone, the signal devices are supposed to focus on detecting and converting. For example, for the weak signals, the radar focuses on finding the target objects as early as possible, when the SNR is allowed to be reasonably low. The SNR increases rapidly along with the strengthened signals; within the medium and strong signal zones, the high SNR is required. The above arrangement of the parameter balances the two features, the SNR $[S_j/N_j]_{dB}$ and the signal dynamic range, to a limit level.

TABLE 1

| ($V_p = 10000\Delta$; Q = 128) | | | |
|---|---|---|---|
| $V_\theta$ | $\eta$ | $[S_j/N_j]_{dB}$ | dynamic range |
| 10Δ | 1.05545 | 36.15 | 60 |
| 5Δ | 1.06118 | 35.32 | 66 |
| 2Δ | 1.0688 | 34.33 | 74 |
| 1Δ | 1.07461 | 33.65 | 80 |
| 0.1Δ | 1.09411 | 31.72 | 100 |

An example is listed as follows to illustrate how to accomplish the design of the present invention. Firstly, setting all of the quantized points $V_\theta\sim V_{Q-1}$ and determining the quantization resistances $R_\theta\sim R_Q$ based on the parameters listed at the first line of Table 1, wherein the SNR $[S_j/N_j]_{dB}=36.15$ but the signal dead zone $V_\theta=10\Delta$ is one order of magnitude larger than the quantization step size $\Delta V_1=0.05545\Delta$, which causes the waste of resource; secondly, adjusting the signal dead zone $V_\theta=10\Delta$ into $V^\#_\theta=V_\theta/10=1\Delta$, namely letting $R^\#_\theta=R_\theta/10$, in such a manner that the post-adjusting signal dead zone $V^\#_\theta=1\Delta$ and the quantization step size $\Delta V_1=0.05545\Delta$ are at the identical order of magnitude, which greatly reduces the signal dead zone; thirdly, computing the SNR to obtain Table 2 based on the post-adjusting equation $$[S_j/N_j]_{dB} = 10\log 4(3(X+1/2)^2+1/4) \approx 10.792 + 20\log (V^\#_{j-1}/\Delta V_j + 1/2) \qquad (1.5.3),$$

wherein it is confirmed that the minimal SNR is within an available range, as well as that the SNR increases rapidly with the strengthening of the signal and quickly gets close to the maximum value 36.15. The dynamic range including the section of low SNR expands into 80 dB after the adjusting from the previous 60 dB, as showed in Table 2.

TABLE 2

| $V_\theta = 10\Delta$; $\eta = 1.05545$; $V^\#_\theta = 1\Delta$; $[S_j/N_j]_{dB} = 36.15$ dB; dynamic range = 80 dB | | | | |
|---|---|---|---|---|
| j | $V_{j-1}$ | $\Delta V_j$ | $V^\#_{j-1}$ | $V^\#_{j-1}/\Delta V_j$ | $[S_j/N_j]_{dB}$ |
| 1 | 10.00 | 0.555 | 1.000 | 1.803 | 18.04 |
| 2 | 10.55 | 0.585 | 1.555 | 2.656 | 20.78 |
| 3 | 11.14 | 0.618 | 2.140 | 3.464 | 22.75 |
| 4 | 11.76 | 0.652 | 2.757 | 4.230 | 24.29 |
| 5 | 12.41 | 0.688 | 3.409 | 4.955 | 25.53 |
| 6 | 13.10 | 0.726 | 4.097 | 5.462 | 26.56 |
| 7 | 13.82 | 0.767 | 4.824 | 6.293 | 27.43 |
| 8 | 14.59 | 0.809 | 5.590 | 6.910 | 28.19 |
| 9 | 15.40 | 0.854 | 6.399 | 7.494 | 28.85 |
| 10 | 16.25 | 0.901 | 7.253 | 8.048 | 29.43 |
| 11 | 17.15 | 0.951 | 8.154 | 8.573 | 29.95 |
| 12 | 18.11 | 1.004 | 9.11 | 9.07 | 30.41 |
| 13 | 19.11 | 1.060 | 10.11 | 9.54 | 30.83 |
| 14 | 20.17 | 1.118 | 11.17 | 9.99 | 31.20 |
| 15 | 21.29 | 1.180 | 12.29 | 10.41 | 31.55 |
| 16 | 22.47 | 1.246 | 13.47 | 10.81 | 31.86 |

The following are some illustrations about the present invention.

The multi-stage parallel super-high-speed ADC and DAC of the logarithmic companding law, provided by the present invention, are respectively simplified as the logarithmic ADC and the logarithmic DAC; the logarithmic ADC and the logarithmic DAC together are named as the logarithmic ADDA; sub-stages of the logarithmic ADC, the logarithmic DAC and the logarithmic ADDA are respectively simplified as sub-ADC, sub-DAC, sub-ADDA; two and more than two sub-stages are defined as multi-stage; the logarithmic ADDA comprises the multi-sub-ADDAs; AD##, DA##, A##D, AD#, DA# and A#D are respectively symbols of the logarithmic ADC, the logarithmic DAC, the logarithmic ADDA, the sub-ADC, the sub-DAC and the sub-ADDA.

$\lambda$ is a wildcard character substituted for $\alpha, \beta, \gamma \ldots$; in order to avoid conflicts of numbering, $\alpha, \beta, \gamma \ldots$ actually represent $1, 2, 3 \ldots$; stage $\alpha$, stage $\beta$, stage $\gamma \ldots$ respectively represent stage 1, stage 2, stage 3 . . . , wherein stage m is the last stage; stage $\lambda$ has a conversion bit of $q_\lambda$; $\mu=\lambda+1$ represents the next stage of $\lambda$.

Stage α is the top stage, namely the stage α corresponds to the highest $q_\alpha$ bit of N-bit binaries; the bit numbers respectively correspondent to stage β, stage γ . . . decrease successively; for example, N=4 stages*3 bits=12 bits; the three bits, $D_{\alpha 2}D_{\alpha 1}D_{\alpha 0}$, of stage α correspond to the highest $D_{11}D_{10}D_9$ bit; the three bits, $D_{\beta 2}D_{\beta 1}D_{\beta 0}$, of stage β correspond to the second high $D_8D_7D_6$ bit . . . .

The stage-potential switch JDWKG comprises the multi-channel switches DLKG and the threshold switches LJKG. The two types of switches are equivalent, so any illustration about the one type applies to the other type.

For the logarithmic ADC, the alternating analog voltage signal, represented by the lowercase $u_{\alpha y}$, only appears before the front-end circuit at the stage α; $U_{\lambda y}$ represents the positive fluctuating analog voltage signal inputted at the stage λ which is simplified as the input voltage $U_{\lambda y}$ thereafter; the inputted voltage $U_{\lambda y}$ is converted into the stage-potential $V_{\lambda G}$, and then the stage-potential $V_{\lambda G}$ is converted into the digital signal $D_{\lambda (q-1)} \ldots D_{\lambda 0}$ wherein the stage-potential $V_{\lambda G}$ works as a bridge.

For the logarithmic DAC, the digital signal at the stage λ $D_{\lambda (q-1)} \ldots D_{\lambda 0}$ is converted into the stage-potential; through proportional attenuation, the stage-potential becomes the outputted positive analog voltage signal, or the output voltage for short.

The input voltage and the output voltage together are called the analog voltage.

Hereafter, the sub-stage all-parallel ADC is called the parallelizer for short; the sampling/holding device is called the sampler/holder CB for short.

The specifically embodied circuits are various, and the circuit illustrated in the present invention is only exemplary.

The nature of the symbol remains regardless of the subscripts; for example, CB is the sampler/holder and $CB_\beta$ is still the sampler/holder, wherein the subscript β is only the stage footnote; the subscript (Q–1)~0 represents step (Q–1)~step 0; the subscript (T–1)~0 represents step (T–1)~step 0; the subscript (q–1)~0 represents bit (q–1)~bit 0; the subscript (t–1) represents bit (t–1)~bit 0; the subscripts α, β and γ represent the stage, and λ is the wildcard character for each stage.

The circuit within the solid frame or the dashed frame is the module whose name is provided at the corner.

The control characters $I^*_{\lambda g}$ and $I_{\lambda g}$ are connected with wires, i.e., $I^*_{\lambda g}=I_{\lambda g}$; thus $I^*_{\lambda g}$ and $I_{\lambda g}$ refer to the same control character; $I_{\lambda g}$ is showed at the output terminal of the comparator, and $I_{\lambda g}$ is showed at the control terminal of the threshold switch.

If the defined symbol, such as $V_1$, is given a renewed definition, the symbol represents the renewed definition thereafter.

The voltage follower, abbreviated as follower, is the integrated operational amplifier (integrated op-amp) having the short connection of the inverting input terminal (abbreviated as the inverting terminal) and the output terminal. One skilled in the electronics understands that the signal is inputted via the non-inverting input terminal (abbreviated as the non-inverting terminal) and that the voltage of the output terminal accurately follows and equals the inputted signal. In other words, the voltage drop of the signal voltage from the input terminal to the output terminal is extremely small (smaller than $10^{-8}V$); technically speaking, the voltage drop is zero, or the on-resistance is zero. Meanwhile, the input resistance is extremely larger (as large as $10^9 \Omega$); technically speaking, the input resistance is infinitely great. The follower is represented by a triangle without any number.

The input signal voltage and the output signal voltage of the voltage follower switch, or the follower switch for short, have the effective intervals. All the signal voltages mentioned in the present invention are within the effective intervals. The follower switch has various logic relations, and the threshold switch is one type of the follower switch.

The threshold switch $S_{\lambda g}$ represents the threshold switch at the step g, stage λ. $S_{\lambda g}$ has the upper control character $I_{\lambda (g+1)}$ and the lower control character $I_{\lambda g}$. The step number at each stage can be different; the variable symbol of the step number at each stage is uniformly represented by g, only for convenience.

In order to simplify the illustration, the present invention makes following appointments. The reference points $V_{\lambda (Q-1)} \sim V_{\lambda 1}$ are correspondently connected to the inverting terminals of the comparators $C_{\lambda (Q-1)} \sim C_{\lambda 1}$; the to-be-compared analog voltage $U_{\lambda Z}$, or the to-be-compared voltage for short, are connected to the non-inverting terminals of the comparators $C_{\lambda (Q-1)} \sim C_{\lambda 1}$; the positive logic is adopted, wherein "1" represents that $U_{\lambda Z}$ is higher than the reference voltage and "0" represents that $U_{\lambda Z}$ is lower than the reference voltage; for example, supposing that the stage λ has a threshold point G, for the to-be-compared voltage at stage $\lambda U_{\lambda Z} > (V_{\lambda G} \sim V_{\lambda 0})$, the control characters $I_{\lambda G} \sim I_{\lambda 0}$ correspondent to the reference points $V_{\lambda G} \sim V_{\lambda 0}$ are equal to 1; and for $U_{\lambda Z} < (V_{\lambda G} \sim V_{\lambda (G+1)})$, the control characters $I_{\lambda G} \sim I_{\lambda (G+1)}$ correspondent to the reference points $V_{\lambda G} \sim V_{\lambda (G+1)}$ are equal to zero. The opposite appointment is also acceptable.

SUMMARY OF THE PRESENT INVENTION

Multi-stage parallel super-high-speed ADC and DAC of a logarithmic companding law have a characteristic of a logarithmic ADDA comprising multi-sub-ADDAs, wherein at least one sub-ADDA comprises a stage-potential processing device, wherein the stage-potential processing device at stage λ comprises two general modules.

The first general module is a potential generating module at stage λ which comprises a resistor chain for generating reference potential points and a stage-potential determining circuit. Let $Q=2^q$, the reference potential points of the sub-ADDA at stage λ bit q are formed by series connected Q resistors; the resistor chain of the series connected Q resistors forms Q+1 potential points $V_{\lambda Q}, V_{\lambda (Q-1)} \ldots V_{\lambda 1}, V_{\lambda 0}$, among which $V_{\lambda (Q-1)} \ldots V_{\lambda 1}, V_{\lambda 0}$ are the reference potential points at step Q stage λ, wherein $V_{\lambda Q}$ is equal to $V_p$ at a power source anode, and is excluded from the reference potential at step Q. Let g equal to some point whose step subscript is within (0~Q–1), point g is called a test point, and $V_{\lambda g}$ is called the reference potential at step g stage λ. A quantization distance, also called a step difference, $\Delta_{\lambda g} = V_{\lambda (g+1)} - V_{\lambda g}$; when a to-be-compared voltage $U_{\lambda Z}$ falls within a conversion range $V_{\lambda Q} \sim 0$, there is always a point G correspondent to $U_{\lambda Z}$, wherein, when g=G, $V_{\lambda (G+1)} > U_{\lambda Z} > V_{\lambda G}$ and $U_{\lambda Z} - V_{\lambda G} < \Delta_{\lambda G}$. Particularly, point G is named as a stage point, and $V_{\lambda g}$ at the stage point G is the reference point which is smaller than and closest to $U_{\lambda Z}$ and is a special reference point among the reference points $V_{\lambda (Q-1)} \sim V_{\lambda 0}$, especially marked as $V_{\lambda G}$ which is a stage-potential at stage λ. Relative to the sub-ADDA at stage λ, the stage-potential $V_{\lambda G}$ is a conversion value of $U_{\lambda Z}$. The stage-potential $V_{\lambda G}$ is actually a bridge between the to-be-compared voltage $U_{\lambda Z}$ at stage λ and digital signals $D_{\lambda(q-1)} \ldots D_{\lambda 0}$ at stage $\lambda$; the stage-potential $V_{\lambda G}$ corresponds not only to digitals, but also to analogs, and is a digitized analog value. Taken a further consideration, there exists a problem that it is wrong to express the stage point of each stage with g and G, because the test point of each stage among m sub-stages is independent, and thus the stage point of each stage can be different. In order to simplify illustration of the present invention, the present invention makes following appointments: at stage $\alpha, \beta, \gamma, \delta \ldots$, the test points are respectively represented by a, b, c, d . . . , and the stage points are respectively represented by A, B, C, D . . . ; g is a wildcard character substituted for the symbol of each test point, so g is a wildcard of the test point; G is a wildcard character substituted for the symbol of each stage point, so G is the wildcard of the stage point; without misunderstanding, the wildcard characters g and G are uniformly used to illustrate principles.

The second general module is a stage-potential extracting module. For the sub-ADDA at stage $\lambda$, although it can be determined that which of the reference potential points $V_{\lambda(Q-1)} \sim V_{\lambda 0}$ is the stage-potential $V_{\lambda G}$, the stage-potential $V_{\lambda G}$ still remains to be extracted, which requires the stage-potential extracting module. The stage-potential extracting module is a stage-potential switch. A group of threshold switches forms the stage-potential switch. The stage-potential switch $JDWKG_\lambda$ comprises a threshold switch group $LJKGZ_\lambda$ and a multi-channel switch $DLKG_\lambda$, wherein the threshold switch group is the group of the threshold switches whose output terminals are parallel connected into a common terminal and whose input terminals form an input terminal group of the threshold switch group. Control characters are provided for directly choosing and connecting one of the input terminals as a strobe terminal. The threshold switch $S_{\lambda g}$ at step g stage $\lambda$ has an upper control character $I_{\lambda(g+1)}$ and a lower control character $I_{\lambda g}$. Table 3 shows logic relations among $S_{\lambda g}, I_{\lambda(g+1)}$ and $I_{\lambda g}$.

TABLE 3

| logic of $S_{\lambda g}$ | | |
|---|---|---|
| $I_{\lambda g}$ | $I_{\lambda(g+1)}$ | $S_{\lambda g}$ |
| 0 | 0 | OFF |
| 0 | 1 | OFF |
| 1 | 0 | ON |
| 1 | 1 | OFF |

The threshold switch group has a strobe control as follows. Firstly, let $I_{\lambda Q}=0$ and $I_{\lambda 0}\equiv 1$, the upper and the lower control characters $I_{\lambda(g+1)}$ and $I_{\lambda g}$ of $S_{\lambda g}$ are respectively connected to and equal to potential comparison values $I^*_{\lambda(g+1)}$ and $I_{\lambda g}$; when $I_{\lambda(g+1)}=1$ or $I_{\lambda g}=0$, the switch point $S_{\lambda g}$ is disconnected; only when the switch point $S_{\lambda g}$ satisfies the requirements of $I_{\lambda(g+1)}=0$ and $I_{\lambda g}=1$, namely the switch point $S_{\lambda g}$ is at a threshold point G having the upper control character "0" and the lower control character "1", the switch point $S_{\lambda g}$ is connected and becomes a strobe point $S_{\lambda G}$. A potential at the strobe point $S_{\lambda G}$ is a potential at step G stage $\lambda$, $V_{\lambda G}$; $V_{\lambda G}$ is called the stage-potential of stage $\lambda$.

The stage-potential $V_{\lambda G}$ is a bridge of A/D conversion and D/A conversion, and corresponds respectively to the digital signals $D_{\lambda(q-1)} \sim D_{\lambda 0}$ and the to-be-compared voltage $U_{\lambda Z}$, wherein the corresponding is accomplished via a correspondence between the reference points $V_{\lambda(Q-1)} \cdot V_{\lambda 0}$ and the control characters $I_{\lambda(Q-1)} \sim I_{\lambda 0}$, and a correspondence between the reference points $V_{\lambda(Q-1)} \sim V_{\lambda 0}$ and the threshold switch group $S_{\lambda(Q-1)} \sim S_{\lambda 0}$. The stage-potential $V_{\lambda G}$ is a threshold point among the reference points $V_{\lambda(Q-1)} \sim V_{\lambda 0}$, and is determined through values of the control characters $I_{\lambda(Q-1)} \sim I_{\lambda 0}$ and the strobe terminal of the threshold switch group $S_{\lambda(Q-1)} \sim S_{\lambda 0}$.

The stage-potential $V_{\lambda G}$ is obtained through the correspondence between the reference points $V_{\lambda(Q-1)} \sim V_{\lambda 0}$ and the control characters $I_{\lambda(Q-1)} \sim I_{\lambda 0}$, and the correspondence between the reference points $V_{\lambda(Q-1)} \sim V_{\lambda 0}$ and the switch group $S_{\lambda(Q-1)} \sim S_{\lambda 0}$.

Firstly, the correspondence between $V_{\lambda(Q-1)} \sim V_{\lambda 0}$ and the digital signals, or the correspondence between $V_{\lambda(Q-1)} \sim V_{\lambda 0}$ and the control characters $I_{\lambda(Q-1)} \sim I_{\lambda 0}$ which convert into the digital signals, is illustrated as follows. Since "1" represents that the to-be-compared voltage is higher than the reference point voltage; among the reference points $V_{\lambda(Q-1)} \sim V_{\lambda 0}$, $V_{\lambda G}$ is the threshold point, when the to-be-compared voltage at stage $\lambda$ $U_{\lambda Z} > (V_{\lambda G} \sim V_{\lambda 0})$, the control characters $I_{\lambda G} \sim I_{\lambda 0}$ correspondent to the reference points $V_{\lambda G} \sim V_{\lambda 0}$ are equal to 1; in other words, each threshold switch $(S_{\lambda(G-1)} \sim S_{\lambda 0})$ connected below $V_{\lambda G}$ (g=0~(G-1)) has the control character $I_{\lambda(g-1)}=I_{\lambda g}=1$, so $(S_{\lambda(G-1)} \sim S_{\lambda 0})$ are at states of OFF in Table 3; when $U_{\lambda z}<(V_{\lambda Q} \sim V_{\lambda(G+1)})$, the control characters $I_{\lambda Q} \sim I_{\lambda(G+1)}$ correspondent to the reference points $V_{\lambda Q} \sim V_{\lambda(G+1)}$ are equal to zero; in other words, each threshold switch $(S_{\lambda(G+1)} \sim S_{\lambda(Q-1)})$ connected above $V_{\lambda G}$ (g=(G+1)~(Q-1)) has the control character $I_{\lambda(g+1)}=I_{\lambda g}=0$, so $(S_{\lambda(G+1)} \sim S_{\lambda(Q-1)})$ are at states of OFF too; only when the threshold switch $S_{\lambda G}$ at the threshold point G has the control characters $I_{\lambda(G+1)}=0$ and $I_{\lambda G}=1$, $S_{\lambda G}$ is at a state of ON in Table 3. Secondly, $V_{\lambda(Q-1)} \sim V_{\lambda 0}$ and the correspondent $S_{\lambda(Q-1)} \sim S_{\lambda 0}$ are connected directly, or correspondently (which means one-to-one via an arithmetic circuit). The strobe point $S_{\lambda G}$ among $S_{\alpha(Q-1)} \sim S_{\lambda 0}$ extracts out the stage-potential $V_{\lambda G}$, or a stage output value via an operation on $V_{\lambda G}$, sends the extracted stage-potential $V_{\lambda G}$ into a main line $S_\lambda$ of the stage-potential switch; the sent stage-potential $V_{\lambda G}$ and the stage output values of other sub-ADDAs are collected and calculated, for accomplishing the A/D and D/A conversions. The so-called stage-potential $V_{\lambda G}$ is the reference point potential closest to the to-be-compared voltage $U_{\lambda Z}$; $V_{\lambda G}$ and $U_{\lambda Z}$ have a relation of: $V_{\lambda G}=U_{\lambda Z}-U_{\lambda x}$, wherein $U_{\lambda x}$ is a residue voltage which is smaller than a span of the reference point voltage.

The multi-channel switch is a threshold switch group in essence, except that the control characters of the multi-channel switch are formed by decoding the digital signals; in other words, the multi-channel switch comprises a decoder and a threshold switch, wherein firstly the digital signals are decoded into the control characters by the decoder, and then one switch point of the threshold switch group is chosen and connected to be a strobe point through the control characters. The threshold switch group and the multi-channel switch are equivalent and alternative, and are generally called the stage-potential switch.

The threshold switch comprises the conventional switch having a signal loss, and a lossless threshold switch, or a lossless switch for short, provided by the present invention. The lossless switch comprises a voltage follower switch (follower switch) which functions as a signal switch for transmitting or blocking signals, wherein the voltage follower switch comprises two modules, a module of a voltage follower (follower) and a module of a power source loop switch (power source switch). The power source switch is an electronic device provided on an operational power source loop (power source loop) of the follower; connection and disconnection of the power source loop of the follower is controlled by the control characters, so as to control connection and disconnection of a signal loop of the follower.

These and other objectives, features, and advantages of the present invention will become apparent from the following detailed description, the accompanying drawings, and the appended claims.

BRIEF DESCRIPTION OF THE DRAWINGS

FIG. 1.1 is a sketch view of a threshold switch according to Embodiment 1.1 of the present invention, wherein subscript $\lambda g$ represents step g stage $\lambda$; rectangular block $S_{\lambda g}$ is a threshold switch at step g stage $\lambda$; $V_{\lambda g}$ is a signal point at step g stage $\lambda$; $I_{\lambda g}$ is a control character at step g stage $\lambda$; $V_{\lambda(g+1)}$ is a control character at step g+1 stage $\lambda$; $S_\lambda$ is a switch main line at stage $\lambda$; $V_{\lambda g}$ is a potential of the main line at stage $\lambda$.

FIG. 1.2.1 is a schematic diagram of a lossless switch type $S_{\lambda g1}$ according to Embodiment 1.2.1 of the present invention, wherein $A_{\lambda g}$ is a follower; $V_{\lambda g}$, $I_{\lambda g}$, $I_{\lambda(g+1)}$, $S_\lambda$ and $V_{\lambda G}$ are identical to those showed in FIG. 1.1; VT1 and VT3 are NPN transistors; VT0 and VT2 are PNP transistors; $+V_P$ is an anode of a power source and $-V_N$ is a cathode of the power source; a circuit within a dashed frame forms the lossless threshold switch $S_{\lambda g1}$.

FIG. 1.2.2 is a schematic diagram of a lossless switch type $S_{\lambda g2}$ according to Embodiment 1.2.2 of the present invention, wherein $A_{\lambda g}$, $V_{\lambda g}$, $I_{\lambda g}$, $I_{\lambda(g+1)}$, $S_\lambda$, $+V_P$ and $-V_N$ are identical to those showed in FIG. 1.2.1; VT4 to VT9 are all NPN transistors; $V_{5C}$ and $V_{8C}$ are respectively potentials of collector terminals of VT5 and VT8; $R_\lambda$ is a resistor; a circuit within a dashed frame forms the lossless threshold switch $S_{\lambda g2}$.

FIG. 1.2.3 is a schematic diagram of a lossless switch in broad sense type $S_{\lambda g3}$ according to Embodiment 1.2.3 of the present invention, wherein KS1 and KS3 are power source switches conducting at high potential; KS0 and KS2 are power source switches conducting at low potential.

FIG. 1.2.4 is a schematic diagram of a q-bit multi-channel switch according to Embodiment 1.2.4 of the present invention, wherein $S_{\lambda 0} \sim S_{\lambda(Q-1)}$ are the threshold switches at steps 0~(Q-1) stage $\lambda$; a solid frame $LJKGZ_\lambda$ is a threshold switch group at stage $\lambda$; $V_{\lambda 0} \sim V_{\lambda(Q-1)}$ are potentials of input terminals at steps 0~(Q-1) stage $\lambda$; $I_{\lambda 0} \sim I_{\lambda Q}$ are control characters at steps 0~(Q-1) stage $\lambda$; $d_{\lambda 0} \sim d_{\lambda(q-1)}$ are control terminals of the multi-channel switch at stage $\lambda$; $JM_\lambda$ is a decoder; a dashed frame $DLKG_\lambda$ represents the multi-channel switch at stage $\lambda$.

FIG. 1.3, FIG. 1.4 and FIG. 1.5 are referred in the theoretical analysis about the AD conversion having a constant SNR.

FIG. 1.3 is a diagram of SNR curves of 7-bit companding codes respectively of A-compression-law, $\mu$-compression law and a logarithmic compression law, wherein SNR curve of A-compression-law-1; SNR curve of $\mu$-compression law-2; SNR curve of logarithmic compression law having a constant SNR-3; SNR curve of logarithmic compression law having an adjusted SNR-4.

FIG. 1.4 is a sketch view of a q-bit all-parallel ADC, wherein $Q=2^q$; Q is a quantization step number; $V_\theta$ is a base potential point, and $V_1$ is a start potential point; $V_\theta$ is $V_0$; in order to distinctly differ from other potential points, $V_0$, a key potential point, is represented by $V_\theta$; similarly, $R_\theta$ is a base resistance and $R_1$ is a start resistance; $V_\theta$ and $V_1 \sim V_{Q-1}$ are potential reference points which are dependent on a determination of resistances of the resistors $R_\theta \sim R_Q$; the resistances of the resistors $R_\theta \sim R_Q$ are determined according to practical needs; u is an analog input signal; $C_1 \sim C_{Q-1}$ are comparators; BMQ is an encoder for encoding Q states of $y_0 \sim y_{Q-1}$ into q-bit binaries $D_0 \sim D_{q-1}$; common symbols, such as $V_p$, an anode of a power source, and a ground terminal, are also used in following drawings, without repeating explanation again.

FIG. 1.5 is a partial view of compression characteristics, wherein Q-1 quantized points $V_A$ $V_2$ ... $V_{Q-1}$ are inserted between $V_\theta$ and $V_P$ on axis V at a geometric $V_{j+1}/V_j=\eta$ interval, as well as $V_\theta$ and $V_Q=V_P$, which means that totally Q+1 quantized points are inserted to divide the interval from $V_\theta$ and $V_P$ into Q sub-intervals to form Q segments; Q+1 coordinate points ($y_0 \sim y_Q$) which are drew on axis Y at evenly spaced intervals, correspond to the digital values and also correspond to the evenly spaced analog values, Q line segments. Let a correspondence between V and y of the compression curve be: $(V_1 \sim V_\theta \sim 0) \to y_0$, $(V_2 \sim V_1) \to y_1$, $(V_3 \sim V_2) \to y_2, \ldots (V_Q \sim V_{Q-1}) \to y_{Q-1}, V_Q \to y_Q$, since $y_{0+}$ and $y_{0-}$ overlap at an origin point, the positive Q sub-intervals and the negative Q sub-intervals are integrated into 2*Q-1 sub-intervals.

Figure 4:
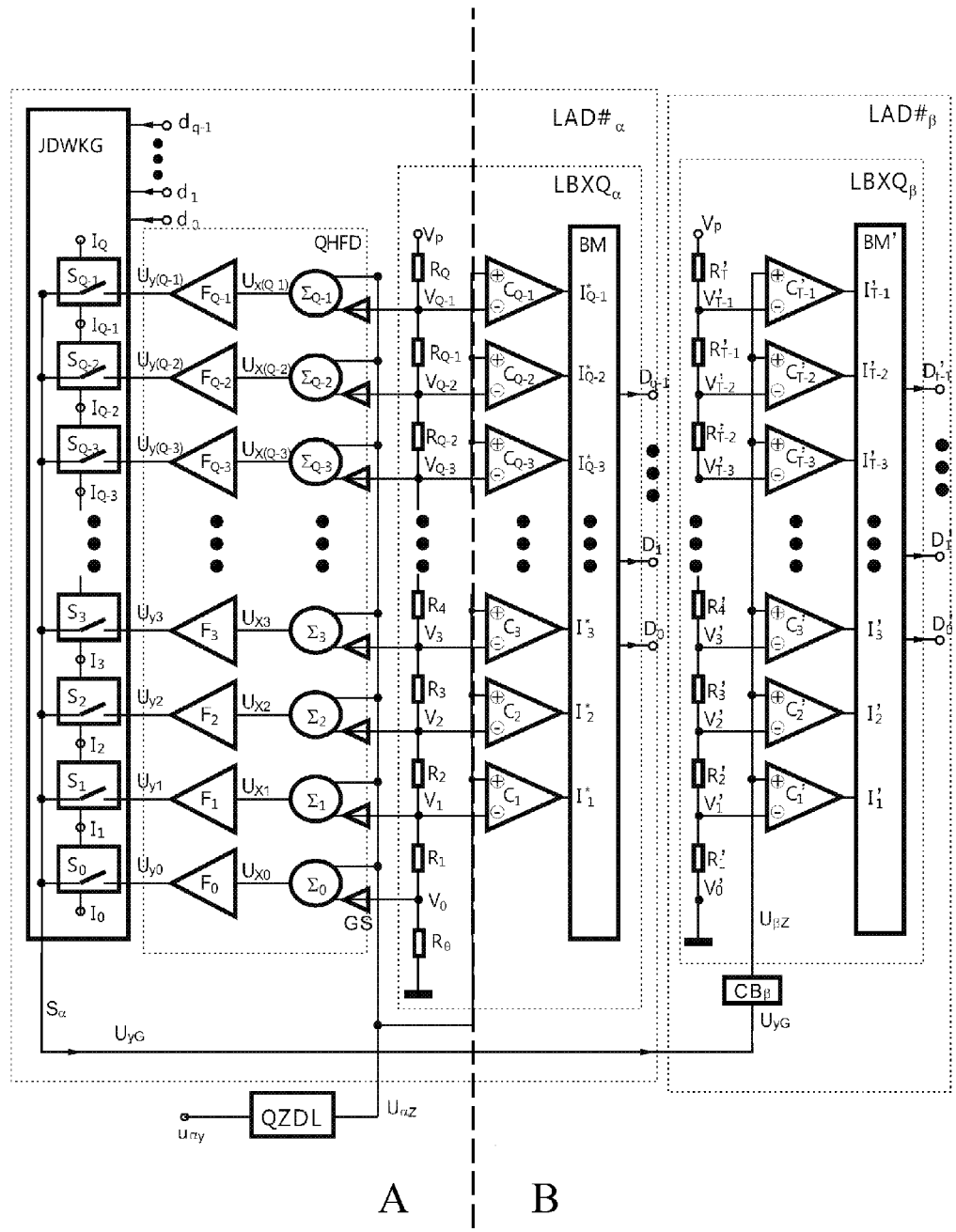

For facilitating reading, view numbers of following drawings are set to be correspondent to embodiment numbers on purpose. The drawings are illustrated in the correspondent embodiments. The drawings and the correspondent embodiments are combined and illustrated. Like reference characters in the drawings indicate corresponding elements throughout the several views, unless being further explained. The subscript $\lambda g$ represents step g stage $\lambda$.

FIG. 2.1A is an enlargement view of part A of FIG. 2.1; FIG. 2.1B is an enlargement view of part B of FIG. 2.1.

FIG. 2.1 is a schematic diagram of m stages*3-bit equal resistance type logarithmic ADC according to Embodiment 2.1 of the present invention, wherein $\lambda$ is a wildcard character substituted for $\alpha$, $\beta$, $\gamma$ and m; $u_{\alpha y}$ is an original input alternating signal; QZDL is a front-end circuit; $AD\#_\lambda$ is an A/D conversion sub-module at stage $\lambda$ of the ADC; $AD\#_\lambda$ is a wildcard character substituted for the sub-modules $AD\#_\alpha \sim AD\#_m$, wherein $AD\#_m$ excludes the threshold switch group $LJKGZ_m$; $U_{\lambda y}$ is an input voltage at stage $\lambda$; $R_{\lambda 8} \sim R_{\lambda 0}$ is a voltage-dividing resistor chain at stage $\lambda$; $V_{\lambda 7} \sim V_{\lambda 0}$ are potential reference points at stage $\lambda$; $C_{\lambda 7} \sim C_{\lambda 1}$ are comparators at stage $\lambda$; $I^*_{\lambda 7} \sim I^*_{\lambda 1}$ are comparison values at stage $\lambda$; $I_{\lambda 8}$ is constantly zero and $I_{\lambda 0}$ is constantly 1; $D_{\lambda 2} \sim D_{\lambda 0}$ are digital output values at stage $\lambda$; $V_p$ is the anode of the power source; $S_{\lambda 7} \sim S_{\lambda 0}$ are switching points of the threshold switches at stage $\lambda$; a solid frame $LJKGZ_\lambda$ comprising $S_{\lambda 7} \sim S_{\lambda 0}$ and the control characters $I_{\lambda 8} \sim I_{\lambda 0}$ is the threshold switch group; $I_{\lambda 8} \sim I_{\lambda 0}$ are the control characters; $I^*_{\lambda g}$ and $I_{\lambda g}$, referring to the same control character, are connected through wires, and so are $I_g$ and $I^*_g$; $S_\lambda$ is the switch main line at stage $\lambda$; $V'_{\lambda g}$ is a stage-potential-to-be at stage $\lambda$; $V_{\lambda G}$ (unshown) is a stage-potential at stage $\lambda$; $V_{\lambda 0}$ is a bottom potential; $\Sigma'_\lambda$ is an elevation summator at stage $\lambda$; $\Sigma_\lambda$ is a residue summator at stage $\lambda$; $U_{\lambda Z}$ is a to-be-compared voltage at stage $\lambda$; $CB_\lambda$ is a sampler/holder at stage $\lambda$; $U^*_{\lambda y}$ is a sampled/held voltage; $U_{\lambda x}$ is a residue voltage at stage $\lambda$; $FD_\lambda$ is a residue voltage amplifier at stage $\lambda$; $U_{\mu y}$ is an amplified value of the residue voltage $U_{\lambda x}$, and $U_{\mu y}$ is also an input voltage of the next sub-module, $AD\#_\mu$; a hollow triangle is a voltage follower.

FIG. 2.2 is a block diagram of the front-end circuit QZDL according to Embodiment 2.2 of the present invention, wherein original input alternating signal-$u_{\alpha y}$; sampler/holer-CB; alternating sampling/holding signal-$u_g$; positive-negative discriminator-$ZFP_x$; positive input voltage-$U_g$; polarity register-$D_X$; analog logarithmic compression law module-Log; input voltage at stage $\alpha$-$U_{\alpha y}$.

FIG. 2.3 is a schematic diagram of the positive-negative discriminator according to Embodiment 2.3 of the present invention, wherein a dashed frame ZFP represents the positive-negative discriminator; $u_g$, $U_g$ and $D_X$ are as illustrated above; operational amplifier YF comprises a positive-negative comparator $YF_A$ and an inverter $YF_B$; inverter input resistor and feedback resistor-$R_{C5}$ and $R_{C6}$; inverting switch-$S_X$.

FIG. 3.1A is an enlargement view of part A of FIG. 3.1; FIG. 3.1B is an enlargement view of part B of FIG. 3.1.

FIG. 3.1 is a schematic diagram of m stages*3-bit equal resistance type logarithmic DAC according to Embodiment 3.1 of the present invention, wherein $V_{\lambda G}$, $V'_{\lambda G}$, $R_{\lambda 8}$~$R_{\lambda 0}$, $V_{\lambda 7}$~$V_{\lambda 0}$, $I_{\lambda 8}$~$I_{\lambda 0}$, $S_\lambda$, $CB_\lambda$, GS, $LJKGZ_\lambda$, multi-channel switch $DLKG_\lambda$ and stage-potential switch $JDWKG_\lambda$ are all as illustrated above; further, logarithmic sub-DAC at stage $\lambda$-$DA\#_\lambda$, decoder at stage $\alpha$-solid frame $JM_\alpha$, input terminals of $JM_\alpha$-$d_{\alpha 2}$~$d_{\alpha 0}$. Herein the control characters $I_{\alpha 7}$~$I_{\alpha 1}$ obtained after decoding determine a stage-potential strobe point $S_{\alpha G}$; $JM_\alpha$+$LJKGZ_\alpha$=$DLKG_\alpha$; and thus $d_{\alpha 2}$~$d_{\alpha 0}$ are not only the input terminals of $JM_\alpha$, but also control terminals of the multi-channel switch $DLKG_\alpha$; attenuator at stage $\lambda$-$\Psi_\lambda$; analog output signal voltage at stage $\lambda$, or output voltage for short-$V_{\lambda\Psi}$; overall summator -$\Sigma_\Psi$; overall output analog voltage $V_\Psi$.

FIG. 3.2.1 is a sketch view of the triangle GS, the voltage follower, according to Embodiment 3.1 of the present invention, wherein an output voltage and an input voltage are both $U_{X2}$ and thus equal, while a loading capacity is enhanced. The triangle represents the voltage follower throughout all of the drawings, with or without GS.

FIG. 3.2.2 is a sketch view of a proportional attenuator $\Psi_X$ according to Embodiment 3.1 of the present invention, wherein $\Psi$ in upper case is a symbol of the proportional attenuator; subscript X is a wildcard character; $\psi_X$ in lower case (unshown) is an attenuation proportion; input signal $U_{X1}$, output signal $U_{X2}$ and the attenuation proportion $\psi_X$ satisfy an equation of: $U_{X2}=U_{X1}/\psi_X$.

FIG. 3.2.3 is a structural diagram of the proportional attenuator $\Psi_X$ according to Embodiment 3.1 of the present invention, wherein an integrated op-amp GS, namely the voltage follower in FIG. 3.2.1, $R_{X1}$ and $R_{X2}$ form a voltage-dividing circuit; because a non-inverting terminal of the voltage follower GS is an input terminal, which leads to a virtual opening and zero current, equal currents run through $R_{X1}$ and $R_{X2}$, and thus $U_{X2}=U_{X1}*R_{X2}/(R_{X1}+R_{X2})$; let $\psi_X=(R_{X1}+R_{X2})/R_{X2}$, $U_{X2}=U_{X1}/\psi_X$.

Figure 4A:
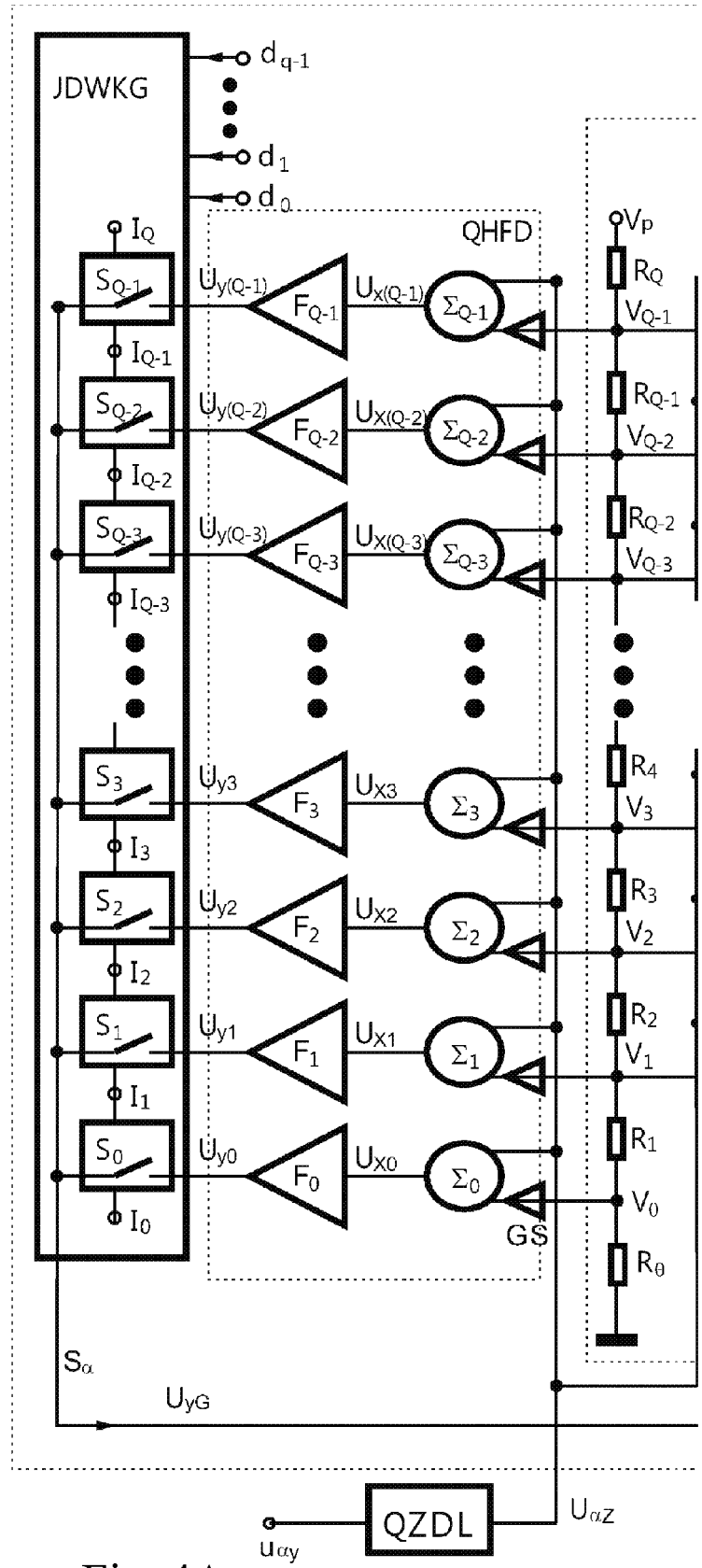
Figure 4B:
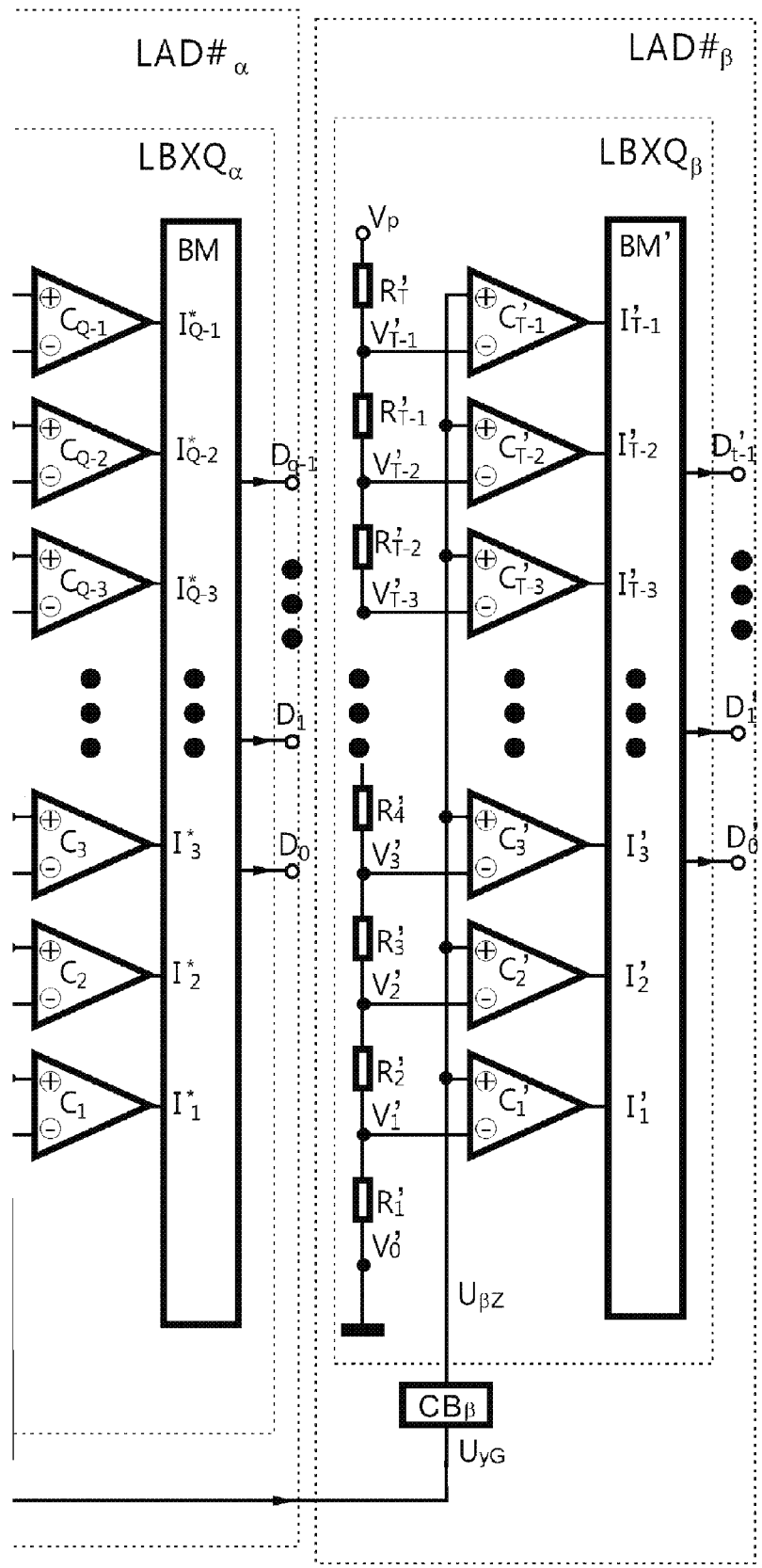

FIG. 4A is an enlargement view of part A of FIG. 4; FIG. 4B is an enlargement view of part B of FIG. 4.

FIG. 4 is a schematic diagram of a two-stage logarithmic chain ADC according to Embodiment 4 of the present invention. Because of logarithmic relations between the resistor chain and a reference potential chain, the ADC is called the logarithmic chain ADC represented by LAD##; the logarithmic chain ADC comprises two sub-stages, $LAD\#_\alpha$ and $LAD\#_\beta$; $LAD\#_\alpha$ is a first-stage logarithmic chain sub-ADC, and $LAD\#_\beta$ is a second-stage logarithmic chain sub-ADC; second-stage elements, namely stage $\beta$ elements, are marked with single quotes ', while first-stage elements, namely stage $\alpha$ elements, are without the single quotes '.

In FIG. 4, $LAD\#_\alpha$ comprises $LBXQ_\alpha$, JDWKG and QHFD, wherein $LBXQ_\alpha$, a first-stage logarithmic chain parallelizer, comprises a first-stage logarithmic resistor chain $R_Q$~$R_1$ and $R_\theta$, first-stage logarithmic reference potential points $V_{Q-1}$~$V_\theta$, first-stage comparators $C_{Q-1}$~$C_1$, first-stage comparison values $I_{Q-1}$~$I_1$, a first-stage encoder BM and first-stage logarithmic digital output signals $D_{q-1}$~$D_0$; QHFD, a summing and amplifying operational circuit, comprises first-stage summators $\Sigma_{Q-1}$~$\Sigma_0$, difference voltages $U_{X(Q-1)}$~$U_{X0}$, amplifiers $F_{Q-1}$~$F_0$, operational voltages $U_{Y(Q-1)}$~$U_{Y0}$ and an operational stage voltage $U_{YG}$; and JDWKG, a stage-potential switch, comprises switching points $S_{(Q-1)}$~$S_0$, control terminals $d_{q-1}$~$d_0$ of a multi-channel switch, first-stage control characters $I_{Q-1}$~$I_1$, $I_Q$ constantly zero, $I_0$ constantly 1, a switch main line $S_\alpha$ and a strobe point voltage drop $V_r$.

In FIG. 4, a main component of $LAD\#_\beta$ is a second-stage logarithmic chain parallelizer $LBXQ_\beta$; $LBXQ_\beta$ comprises a second-stage logarithmic resistor chain $R'_T$~$R'_1$, wherein second-stage logarithmic reference potential points $V'_{T-1}$~$V'_0$ are respectively connected to inverting terminals of second-stage comparators $C'_{T-1}$~$C'_1$; a second-stage to-be-compared voltage $U_{\beta Z}$ is connected to a non-inverting terminal of each second-stage comparator; and then second-stage comparison values $I'_{T-1}$~$I'_1$ are obtained and encoded by a second-stage encoder into second-stage digital output signals $D'_{t-1}$~$D'_0$; $LBXQ_\beta$ further comprises a sampler/holder $CB_\beta$, an operational stage voltage-to-be $U'_{YG}$, an operational stage voltage $U_{YG}$ and the second-stage to-be-compared voltage $U_{\beta Z}$.

Figure 5:
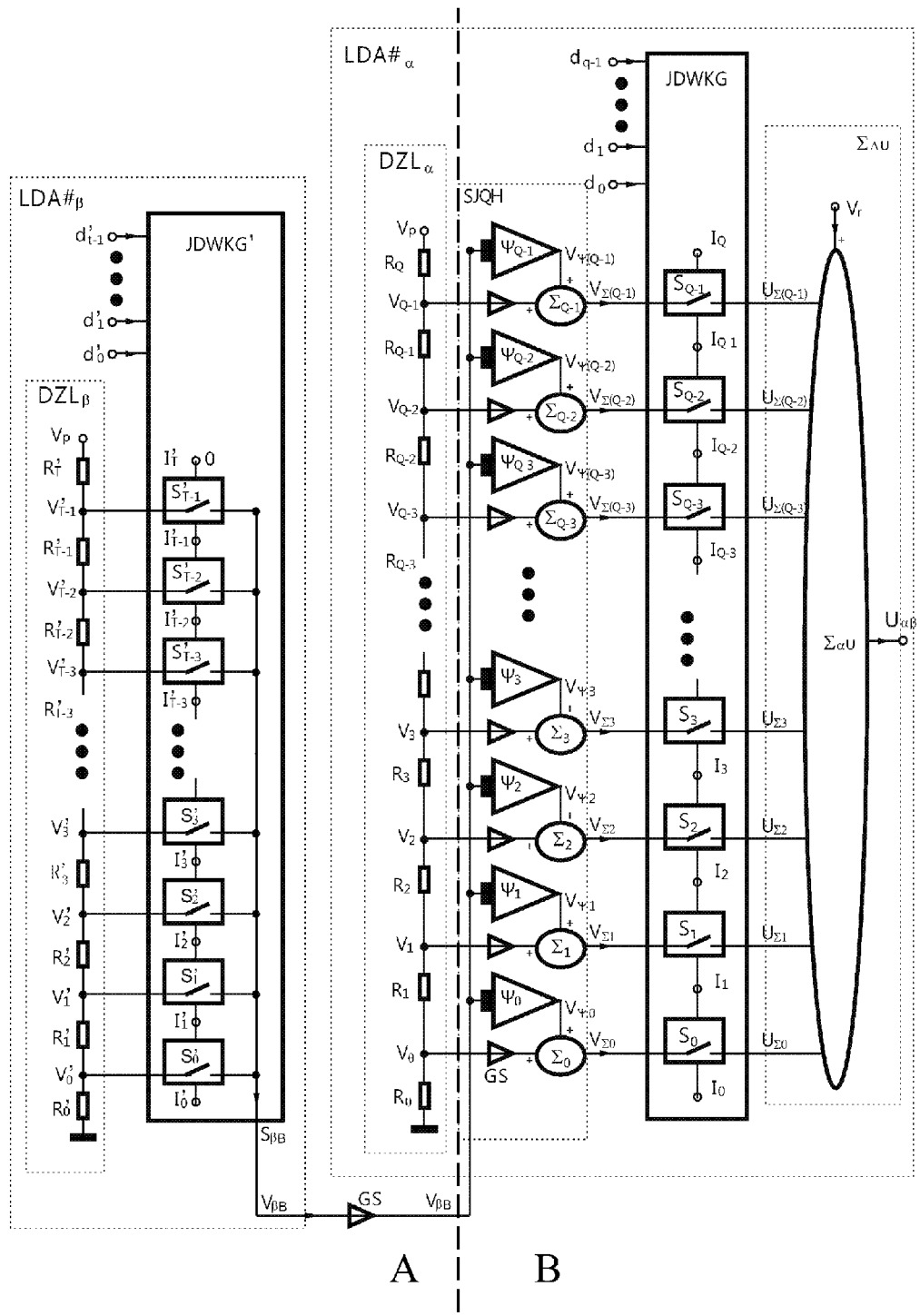
Figure 5A:
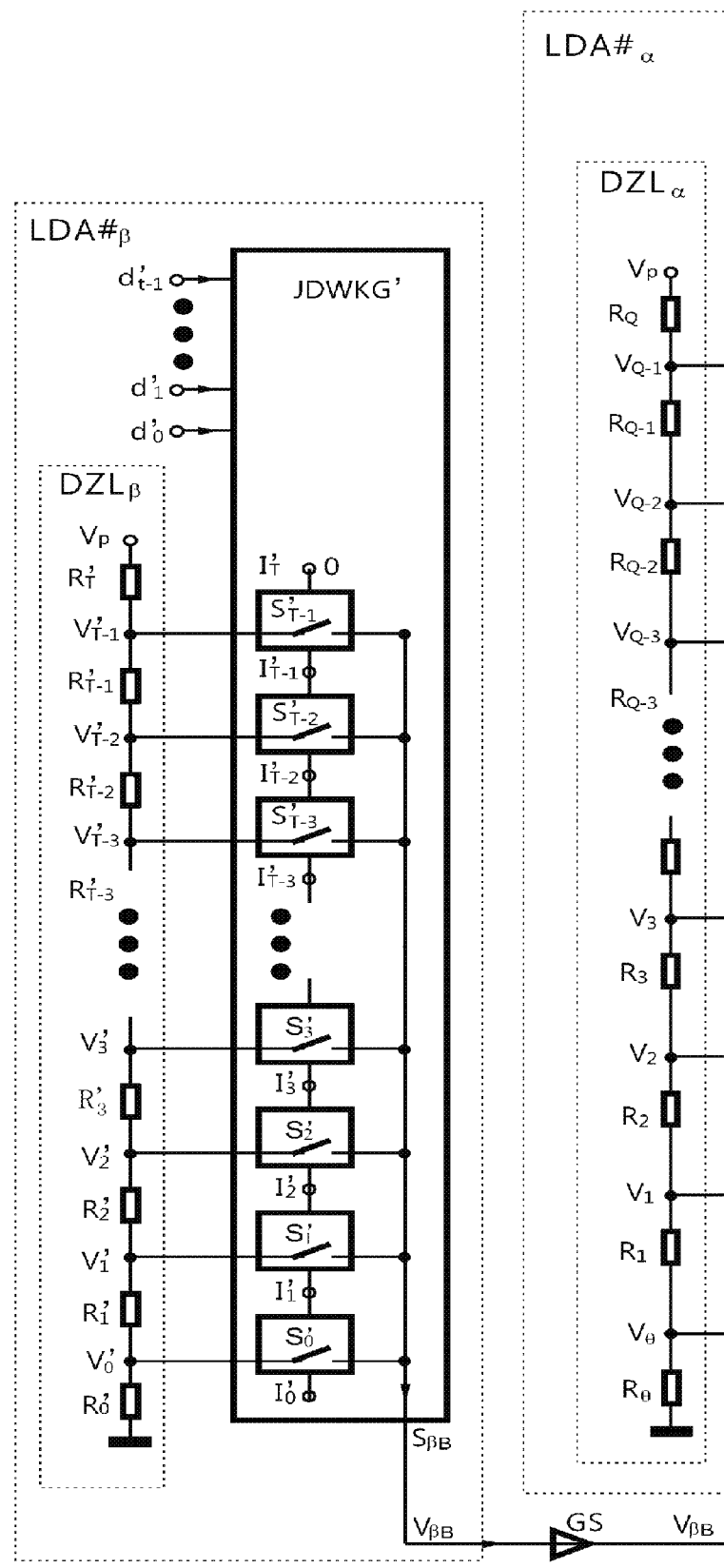
Figure 5B:
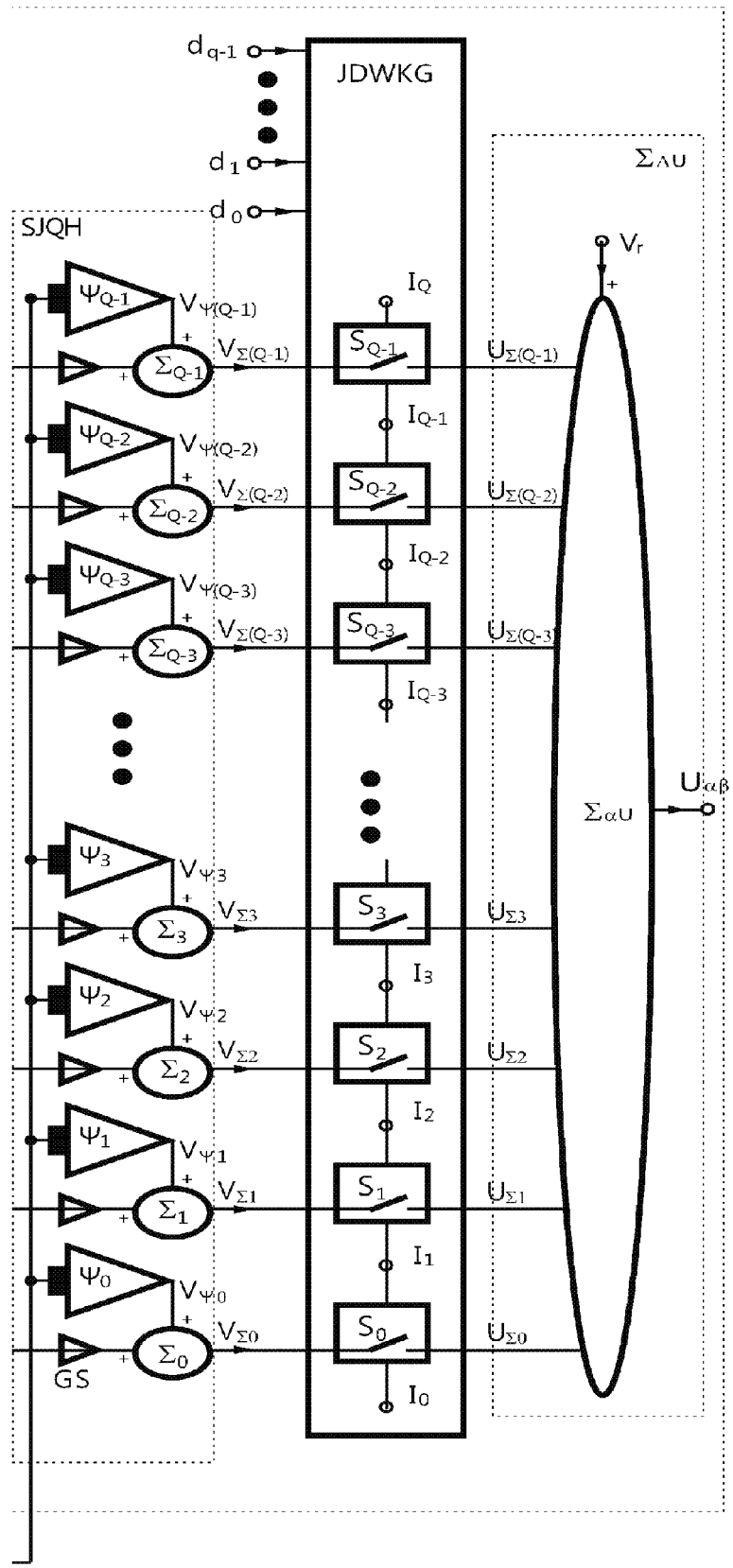

FIG. 5A is an enlargement view of part A of FIG. 5; FIG. 5B is an enlargement view of part B of FIG. 5.

FIG. 5 is a schematic diagram of a two-stage logarithmic chain DAC according to Embodiment 5 of the present invention. Because of logarithmic relations between the resistor chain and the reference potential chain, the DAC is called the logarithmic chain DAC represented by LDA##; the logarithmic chain DAC comprises two sub-stages, $LDA\#_\alpha$ and $LDA\#_\beta$; $LDA\#_\alpha$ is a first-stage logarithmic chain sub-DAC, and $LDA\#_\beta$ is a second-stage logarithmic chain sub-DAC; second-stage elements, namely stage $\beta$ elements, are marked with single quotes ', while first-stage elements, namely stage $\alpha$ elements, are without the single quotes '.

In FIG. 5, $LDA\#_\alpha$ comprises $DZL_\alpha$, SJQH, JDWKG and $\Sigma_{AU}$, wherein $DZL_\alpha$, a first-stage logarithmic resistor chain, comprises a first-stage logarithmic resistor chain $R_Q$~$R_1$ and $R_\theta$, and first-stage logarithmic reference potential points $V_{Q-1}$~$V_\theta$; SJQH, an attenuating and summing module, comprises attenuators $\Psi_{Q-1}$~$\Psi_0$, second-stage stage-potential attenuated value $V_{\Psi(Q-1)}$~$V_{\Psi 0}$, summators $\Sigma_{Q-1}$~$\Sigma_0$, reference potential sum values $V_{\Sigma(Q-1)}$~$V_{\Sigma 0}$ and a follower GS; JDWKG, a first-stage stage-potential switch, comprise first-stage control characters $I_{Q-1}$~$I_2$, $I_Q$ constantly zero, $I_0$ constantly 1, first-stage switching points $S_{(Q-1)}$~$S_0$, and control terminals $d_{q-1}$~$d_0$ of a first-stage multi-channel switch; and $\Sigma_{AU}$, a collecting module, comprises a collector $\Sigma_{\alpha U}$, stage-potential sum values $U_{\Sigma(Q-1)}$~$U_{\Sigma 0}$ and an analog voltage output value $U_{\alpha\beta}$.

In FIG. 5, $LDA\#_\beta$ comprises $DZL_\beta$, JDWKG' and $\Sigma_{\beta U}$, wherein $DZL_\beta$, a second-stage logarithmic resistor chain, comprises a second-stage logarithmic resistor chain $R'_T$~$R'_1$, and second-stage logarithmic reference potential points $V'_{T-1}$~$V'_0$; JDWKG', a second-stage stage-potential switch, comprise second-stage control characters $I'_{T-1}$~$I'_1$, $I'_T$ constantly zero, $I'_0$ constantly 1, second-stage switching points $S'_{(T-1)}$~$S'_0$, and control terminals $d'_{t-1}$~$d'_0$ of a second-stage multi-channel switch.

DETAILED DESCRIPTION OF THE PREFERRED EMBODIMENT

Numbers of the preferred embodiments correspond to the view numbers of the drawings.

Embodiment 1.1

Threshold Switch

Each threshold switch is controlled under two control characters. The threshold switch at step g stage $\lambda$ $S_{\lambda g}$ is controlled under the control characters $I_{\lambda(g+1)}$ and $I_{\lambda g}$ based on control relations showed in Table 3. When $I_{\lambda g}=0$ or $I_{\lambda(g+1)}=1$, the threshold switch $S_{\lambda g}$ cuts off signal; only when $I_{\lambda g}=1$ and $I_{\lambda(g+1)}=0$, the threshold switch $S_{\lambda g}$ transmits signal. The threshold switch comprises a lossy switch and a lossless switch provided by the present invention.

Embodiment 1.1.1

Follower Switch

The lossless switch comprises a follower switch which functions as a signal switch for transmitting or blocking the signal; a voltage follower switch comprises two modules, a module of a follower and a module of a power source switch; the power source switch is an electronic device provided on a power source loop of the follower, and controls connection and disconnection of the power source loop of the follower through the control characters.

The follower is at a state of following voltage when the operational power source is connected, or powering on. Herein the signal is inputted through a non-inverting terminal of the follower; a voltage of an output terminal is accurately equal to a voltage of the non-inverting terminal, in such a manner that the signal is transmitted from the input terminal into the output terminal, which is called signal-on, with a extremely small voltage drop (smaller than $10^{-8}V$). Technically speaking, such a small voltage drop can be seen as zero voltage drop or zero on-resistance, which is similar to an ideal short circuit connection. When the operational power is cut off, or powering off, the output terminal and the non-inverting terminal of the follower are at a state of blocking signal which is also called signal-off. Herein the output terminal and the non-inverting terminal have extremely large resistances (as large as $10^9\Omega$). Technically speaking, such a large resistance can be seen as infinitely large, which is similar to an ideal cutting off.

The follower switch transmits the signal when powering on and blocks the signal when powering off, so the follower switch is capable of controlling the connection and disconnection of the power source loop through the control characters, so as to further control connection and disconnection of a signal loop of the follower. Logic relations about the connection and disconnection of the follower switch formed by the control characters is optional, such as normally open, normally close and threshold switching. In the embodiment of the present invention, the follower switch is embodied as a threshold switch having the logic relations of Table 3. The threshold switch $S_{\lambda g}$ is embodied into various circuit structures; following $S_{\lambda g1}$, $S_{\lambda g2}$ and $S_{\lambda g3}$ are only exemplary.

Embodiment 1.2.1

Lossless Switch $S_{\lambda g1}$

The follower $A_{\lambda g}$ of the lossless switch $S_{\lambda g1}$ comprises an integrated op-amp whose inverting terminal and output terminal are in a short connection. Transistors VT1, VT3, VT0 and VT2 are provided on a power supply loop of $A_{\lambda g}$. Only when $I_{\lambda g}=1$ and $I_{\lambda(g+1)}=0$, $A_{\lambda g}$ is powered on and thus signal-on, wherein $A_{\lambda g}$ is powered on only when $I_{\lambda g}=1$ indicating that VT1 and VT3 are in a saturation conducting, and $I_{\lambda(g+1)}=0$ indicating that VT0 and VT2 are in a saturation conducting. Otherwise, when $I_{\lambda(g=1)}=0$ or $I_{\lambda(g+1)}=1$, $A_{\lambda g}$ is powered off, wherein once $I_{\lambda g}=0$ VT1 and VT3 are cutting off, and once $I_{\lambda(g+1)}=1$ VT0 and VT2 are cutting off too; herein $A_{\lambda g}$ has no amplification effects and is signal-off because of an extremely large input resistance of the non-inverting terminal.

For simplification, one of VT0 and VT2 is arbitrarily in short circuit; one of VT1 and VT3 is arbitrarily in short circuit.

Embodiment 1.2.2

Lossless Switch $S_{\lambda g2}$

Transistors VT4, VT5, VT6, VT7, VT8 and VT9 are provided a power supply loop of the voltage follower $A_{\lambda g}$ of the lossless switch $S_{\lambda g2}$. Only when $I_{\lambda g}=1$ and $I_{\lambda(g+1)}=0$, $A_{\lambda g}$ is powered on and thus signal-on, wherein when $I_{\lambda g}=1$ VT6 and VT9 are in a saturation conducting, and when $I_{\lambda(g+1)}=0$ VT5 and VT8 are cutting off, so that VT4 and VT7 are in a saturation conducting. Otherwise, when $I_{\lambda g}=0$ or $I_{\lambda(g+1)}=1$, $A_{\lambda g}$ is powered off and thus signal-off, wherein once $I_{\lambda g}=0$ VT6 and VT9 are cutting off, and once $I_{\lambda(g+1)}=1$ VT5 and VT8 are in a saturation conducting, which leads to low potentials of collector terminals $V_{5C}$ and $V_{8C}$ and further leads to cutoff of VT4 and VT7.

For simplification, one of VT6 and VT9 is arbitrarily in short circuit; one of VT4 and VT7 is arbitrarily in short circuit.

Embodiment 1.2.3

Lossless Switch $S_{\lambda g3}$ in Broad Sense

The power source switch which controls powering on and powering off $A_{\lambda g}$ has various embodiments. In the broad sense, KS1 and KS3 are power source switches conducting at high potential; KS0 and KS2 are power source switches conducting at low potential. Only when $I_{\lambda g}=1$ and $I_{\lambda(g+1)}=0$, KS1 and KS3 are conducting, and, KS0 and KS2 are also conducting, in such manner that $A_{\lambda g}$ is powered on and thus signal-on. Otherwise, when $I_{\lambda g}=0$ or $I_{\lambda(g+1)}=1$, KS1 and KS3 are cutting off, or, KS0 and KS2 are cutting off, in such a manner that $A_{\lambda g}$ is powered off and thus signal-off.

Embodiment 1.2.4-q-Bit

Multi-Channel Switch

The q-bit multi-channel switch comprises threshold switches at steps 0~(Q–1) stage $\lambda$ $S_{\lambda 0}$~$S_{\lambda(Q-1)}$, wherein the threshold switches are within a frame of a threshold switch group at stage $\lambda$, represented by $LJKGZ_\lambda$; potentials of input terminals at steps 0~(Q–1) stage $\lambda$ $V_{\lambda 0}$~$V_{\lambda(Q-1)}$; control characters at steps 0~(Q–1) stage $\lambda$ $I_{\lambda 0}$~$I_{\lambda Q}$; control terminals of the multi-channel switch at stage $\lambda$ $d_{\lambda 0}$~$d_{\lambda(q-1)}$; and a decoder $JM_\lambda$ for decoding digital signals at the control terminals into the control characters at steps 0~(Q–1) stage $\lambda$ $I_{\lambda 0}$~$L_{\lambda Q}$ and then obtaining a strobe terminal among the potentials of the input terminals at steps 0~(Q–1) $V_{\lambda 0}$~$V_{\lambda(Q-1)}$.

Embodiment 2.1-m

Stages*q-Bit Equal Resistance Logarithmic ADC

In order to simplify the illustration of the present invention, all sub-stages in Embodiment 2.1 and Embodiment 3.1 are q-bit, although theoretically each sub-stage can have different bit numbers. After being processed by a front-end circuit QZDL, an original input alternating signal $u_{\alpha y}$ becomes an input voltage at stage α $U_{α,y}$; an input voltage at stage λ, $U_{λ,y}$ ranges between 0~$V_p$; the sub-ADC at stage λ, AD#$_λ$ processes the input voltage at stage λ, $U_{λ,y}$ with an AD conversion through following five modules and processes thereof.

(1) Stage-Potential $V_{λ,G}$ Generating Module

Let Q=$2^q$, a voltage-dividing resistor chain of a parallelizer at stage λ $R_{λ(Q-1)}$~$R_{λ,0}$ ($R_{λ,0}$=$R'_{λ,0}$+$R_{λ,S}$) form potential reference points at stage λ $V_{λ(Q-1)}$~$V_{λ,0}$, wherein $V_{λ,0}$ is a bottom potential. The reference points $V_{λ(Q-1)}$~$V_{λ,1}$ are correspondently connected to inverting terminals of comparators $C_{λ(Q-1)}$~$C_{λ,1}$ in the parallelizer. The input voltage at stage λ $U_{λ,y}$ becomes a temporary stable voltage $U*_{λ,y}$ through sampling and holding; then summing the bottom potential $V_{λ,0}$ and the temporarily stable voltage $U*_{λ,y}$ forms a to-be-compared voltage $U_{λ,Z}$; the to-be-compared voltage $U_{λ,Z}$ is connected to non-inverting terminals of the comparators $C_{λ(Q-1)}$~$C_{λ,1}$, for being compared with the potential reference points $V_{λ(Q-1)}$~$V_{λ,0}$. Because $V_{λ,Q}$>$U_{λ,Z}$>$V_{λ,0}$, there always exists a threshold point $V_{λ,G}$ which is called a stage-potential within ($V_{λ,Q}$~$V_{λ,0}$). Through $V_{λ,(G+1)}$>$U_{λ,Z}$>$V_{λ,G}$, a threshold point G of comparison values at stage λ$I_{λ(Q-1)}$~$I_{λ,1}$ is determined, satisfying requirements of $I_{λ(Q-1)}$~$I_{λ(G+1)}$=0 and $I_{λ,G}$~$I_{λ,1}$=1; let $I_{λ,Q}$ constantly 0 and $I_{λ,0}$ constantly 1, the comparison values $I_{λ(Q-1)}$~$I_{λ,0}$ are encoded by an encoder $BM_λ$, and then digital output values $D_{λ(q-1)}$~$D_{λ,0}$ of the stage-potential $V_{λ,G}$ are obtained. Herein, with the stage-potential $V_{λ,G}$ as a bridge, the to-be-compared $U_{λ,Z}$ is converted into the stage-potential $V_{λ,G}$ and further into the digital signals $D_{λ(q-1)}$~$D_{λ,0}$.

(2) Switch Error Reducing Module

The switch error reducing module reduces switch errors with following two manners. The first manner is applying identical elevation to the potential of the reference points and the input voltage. Because the conventional analog signal switch (abbreviated as switch) naturally has voltage drop, the reference point potential $V_{λ,0}$ correspondent to $S_{λ,0}$ needs to be high enough to close $S_{λ,0}$, and thus the divided voltage $V_{λ,0}$ obtained through $R_{λ,0}$ is capable of ensuring closing $S_{λ,0}$. Further, because the potentials of the reference points are all elevated by $V_{λ,0}$, the temporarily stable voltage $U*_{λ,y}$ also needs an elevation of $V_{λ,0}$ for an offset, which is accomplished by extracting $V_{λ,0}$ with a follower, sending the extracted $V_{λ,0}$ into an elevation summator $Σ'_λ$ and elevating the input voltage $U*_{λ,y}$ into the to-be-compared voltage $U_{λ,Z}$. Speaking from an aspect of comparing potential, elevating both the potentials of the reference points and the input voltage is equivalent to elevating neither one. After the stage-potential $V_{λ,G}$ is extracted, the strobe point $S_{λ,G}$ decreases by the switch voltage drop $V_{λ,S}$ into the stage-potential-to-be $V'_{λ,G}$. Generally, each switch has a different voltage drop; in the present invention, difference among the voltage drops are ignored, and the voltage drops are uniformly represented by $V_{λ,S}$. Let $R_{λ,0}$=$R'_{λ,0}$+$R_{λ,S}$, and let the voltage drop of $R_{λ,S}$ exactly equal to $V_{λ,S}$, $V_{λ,S}$ is extracted by the follower and then sent into a residue summator $Σ_λ$ for calculation, so as to obtain a residue voltage $U_{λ,X}$=$U_{λ,Z}$−$V'_{λ,G}$−$V_{λ,S}$. The second manner is using the lossless switch. The lossless switch has zero voltage drop, so the stage-potential $V_{λ,G}$ extracted via the strobe point $S_{λ,G}$ gets held. As showed in FIG. 2.1, let $R'_{λ,0}$=0 and $R_{λ,S}$=0, then $V_{λ,0}$=0 and $V_{λ,S}$=0, which means that $R'_{λ,0}$ and $R_{λ,S}$ can be eliminated, and that the follower and the elevation summator $Σ'_λ$ correspondent to $V_{λ,0}$ and $V_{λ,S}$ also can be eliminated; herein $U_{λ,Z}$=$U*_{λ,y}$, and $V'_{λ,G}$=$V_{λ,G}$.

(3) Stage-Potential $V_{λ,G}$ Extracting Module

All sub-stages in AD## needs a module to extract out the stage-potential $V_{λ,G}$ for a preparation of the conversion at next sub-stage, except the final sub-stage. The stage-potential is extracted for the conversion at next sub-stage. Given that a conversion bit number of each sub-stage is q, Q=$2^q$; the voltage $V_p$ is divided by the resistor chain into Q equal voltages; each equal divided voltage ΔV is a fixed value ΔV=$V_p$/Q. The stage-potential $V_{λ,G}$ is lower than the to-be-compared voltage $U_{λ,Z}$, but is the closest reference potential to the to-be-compared voltage $U_{λ,Z}$; and thus, within a measurement accuracy at stage λ, $V_{λ,G}$=$U_{λ,Z}$. The stage-potential switch, a module for finishing the extraction of the stage-potential $V_{λ,G}$, comprises the threshold switch group $LJKGZ_λ$, and the multi-channel switch $DLKG_λ$, wherein the reference potential points $V_{λ(Q-1)}$~$V_{λ,0}$ are arithmetically connected to the switch points $S_{λ(Q-1)}$~$S_{λ,0}$ one by one. A solid frame $LJKGZ_λ$, in AD#$_λ$ represents the threshold switch group, wherein the strobe point $S_{λ,G}$ is determined through the strobe control of the threshold switch group as illustrated above. The strobe point $S_{λ,G}$ corresponds to the stage-potential $V_{λ,G}$, and sends the stage-potential $V_{λ,G}$ into the switch main line $S_λ$.

(4) Inter-Stage Operation Module

The inter-stage operation module comprises a sampler/holder $CB_λ$, the residue summator $Σ_λ$ and a residue amplifier $FD_λ$. The input voltage at stage λ $U_{λ,y}$ becomes the stable $U*_{λ,y}$ through the sampler/holder $CB_λ$; the input voltage of each sub-stage maintains independent and stable within a sampling cycle through the inter-stage sampler/holder $CB_λ$, in such a manner that m sub-stages are capable of parallel operating for forming an pipeline-typed conversion. The residue summator $Σ_λ$ generates the residue voltage $U_{λ,X}$=$U_{λ,Z}$−$V'_{λ,G}$−$V_{λ,S}$. The residue voltage $U_{λ,x}$ is within 0~ΔV; the residue amplifier $FD_λ$ amplifies the residue voltage signal Q times, so as to generate $U_{(λ+1),y}$=$U_{μ,y}$=$Q*U_{λ,x}$. As a result, a range of $U_{λ,y}$ expands into the full scale of 0~$V_p$, and $U_{μ,y}$ becomes the input voltage at stage λ+1 (stage μ). The input voltage at stage μ $U_{μ,y}$ enters AD#$_μ$ at stage μ for the measurement and conversion at a higher accuracy.

(5) Logarithmic Conversion Module and Process Thereof

The logarithmic conversion module comprises an analog conversion and a digital conversion. The digital conversion module is based on converting the overall input voltage $U_{α,y}$ into high-bit digital signals having equal quantization distances, and converting the high-bit digital signals into low-bit digital signals having logarithmic quantization distances through a logarithm table. The analog conversion module is based on converting a linear input voltage into the logarithmic input voltage through an analog logarithm converter before inputting at stage α, while in fact ADC is for converting the logarithmic input voltage into the digital signals having the logarithmic quantization distances.

Embodiment 2.2

Front-End Circuit QZDL

The front-end circuit QZDL works in following principles. When a sampling execution signal arrives, the sampler/holder CB processes the original input alternating signal $u_{α,y}$ with sampling and holding, so as to generate an alternating sampling/holder signal $u_g$ which maintains stable within the sampling cycle. A positive-negative discriminator $ZFP_X$ of the front-end circuit QZDL judges and processes a polarity of $u_g$; when $u_g$>0, let a polarity register $D_X$=0, then a discrimination output signal of $ZFP_X$ $U_g$=$u_g$; when $u_g$<0, let $D_X$=1, $U_g$=−$u_g$. As a result, $U_g$ only has the positive polarity because $U_g$=|$u_g$| and thus is called a positive input voltage $U_g$. An analog logarithmic compression law module Log is optional; the Log module is necessary for the analog LOG compression law. Herein, one skilled in the art is familiar with the arts of the Log module, so the illustration of the Log module is omitted; the logarithmic compression referred in the present invention comprises A-law and μ-law which are approximations to the logarithmic compression law. When QZDL further comprises the Log module, the input voltage at stage α $U_{\alpha y}$ is equal to the logarithmic compression law of $U_g$, and the evenly spaced AD conversion generates the digital signals of the logarithmic compression law. When QZDL excludes the Log module, $U_{\alpha y}=U_g$, and the AD conversion is linear.

Embodiment 2.3

Signal Positive-Negative Discriminator

The signal positive-negative discriminator works in following principles. When $u_g$ is positive, $YF_A$ outputs a low potential, and $D_X=0$; $S_X$ is toggled upwardly for directly outputting $u_g$ into $U_g$; $R_{C5}=R_{C6}$, so $YF_B$ is amplified −1 times. When $u_g$ is negative, $YF_A$ outputs a high potential, and $D_X=1$; $S_X$ is toggled downwardly, in such a manner that an inverter phase of $u_g$ is outputted into $U_g$ through $YF_B$.

Embodiment 3.1-m

Stages*q-Bit Equal Resistance Logarithmic DAC

N-bit digital signals are allocated as m stages*q-bit: $(D_{(N-1)}, \ldots, D_0)=(D_{\alpha(q-1)}, \ldots, D_{\alpha 0}), (D_{\beta(q-1)}, \ldots, D_{\beta 0}), \ldots, (D_{m(q-1)}, \ldots, D_{m0})$. D are sent into the control terminals of the correspondent stage-potential switches: $(d_{\alpha(q-1)}, \ldots, d_{\alpha 0}), (d_{\beta(q-1)}, \ldots, d_{\beta 0}), \ldots, (d_{m(q-1)}, \ldots, d_{m0})$.

The sub-$DAC_\lambda$ at stage λ processes the digital signals at stage λ $(D_{\lambda(q-1)}, \ldots, D_{\lambda 0})$ with a DA conversion through following four modules and processes thereof (1) Stage-Potential $V_{\lambda G}$ Generating Module $Q=2^q$; a voltage-dividing resistor chain $R_{\lambda Q}$~$R_{\lambda 0}$ of a parallelizer at stage λ forms potential reference points $V_{\lambda(Q-1)}$~$V_{\lambda 0}$ at stage λ. After the stage-potential $V_{\lambda G}$ generating module receives the digital signals $(D_{\lambda(q-1)}, \ldots, D_{\lambda 0})$, the reference potential point $V_{\lambda G}$ correspondent to the digital signals becomes the stage-potential; $V_{\lambda 0}$ is a bottom potential.

(2) Switch Error Reducing Module, Identical to the Switch Error Reducing Module of Embodiment 2.1

(3) Stage-Potential $V_{\lambda G}$ Extracting Module

The stage-potential $V_{\lambda G}$ of each stage needs to be extracted out for calculating an output voltage $V_{\lambda \Psi}$ of each stage. The stage-potential $V_{\lambda G}$ extracting module and a process thereof in Embodiment 3.1 are identical to the stage-potential $V_{\lambda G}$ extracting module and process in Embodiment 2.1.

(4) Inter-Stage Operational Module

The stage-potential $V_{\lambda G}$, the output voltage $V_{\lambda \Psi}$ and an attenuation coefficient $\Psi_\lambda$ have a relation of: $V_{\lambda \Psi}=V_{\lambda G}/\Psi_\lambda$, wherein $Q=2^q$; $\Psi_\lambda=Q^{(\lambda-1)}$, namely the attenuation coefficient of an attenuator $\Psi_\lambda$ at stage λ $\Psi_\lambda=Q^{(\lambda-1)}$. λ is a wildcard character substituted for α, β, γ, …, m; α, β, γ, … represented with numbers are α=1, β=2, γ=3, …; and thus, λ represents the stage. For example, stage γ is stage 3, λ=3, then $\Psi_\lambda=Q^2$. A summation of $V_{\lambda \Psi}$ of all stages is executed by an overall summator $\Sigma_\Psi$, so as to generate an overall output analog voltage $V_\Psi$. After the attenuation and the summation, the bottom potential of each stage becomes equal to a constant $V_{RS}$: $V_{RS}=V_{\alpha 0}/\Psi_\alpha+V_{\beta 0}/\Psi_\beta+\ldots+V_{m0}/\Psi_m=V_{\alpha 0}/(Q^{m-\alpha})+V_{\beta 0}/(Q^{m-\beta})+\ldots+V_{m0}/(Q^{m-m})$. A waveform of the overall output analog voltage $V_\Psi$ is only elevated by $V_{RS}$, without being transformed; the waveform of the overall output analog voltage $V_\Psi$ is obtained by subtracting $V_{RS}$ in the overall summator $\Sigma_\Psi$.

(5) Logarithmic Conversion Module

The logarithmic conversion module comprises an analog conversion module and a digital conversion module. The digital conversion module is based on, after receiving low-bit digital signals having logarithmic quantization distances, converting the digital signals into high-bit digital signals having equal quantization distances through an anti-logarithm table, and then converting the high-bit digital signals into analog signals by a high-bit DAC having equal quantization distances. The analog conversion module is based on, after accomplishing the DA conversion by the DAC, converting the logarithmic analog signals into a linear output voltage by an analog anti-logarithmic converter.

Embodiment 4

Two-Stage Logarithmic Chain ADC

The logarithmic chain ADC comprises two sub-stages, $LAD\#_\alpha$ and $LAD\#_\beta$. $LAD\#_\alpha$ is a first-stage logarithmic chain sub-ADC, and $LAD\#_\beta$ is a second-stage logarithmic chain sub-ADC. According to the Embodiment 4 of the present invention, the two-stage logarithmic chain ADC comprises the lossless switch.

The first-stage $LAD\#_\alpha$ executes a q-bit conversion. A logarithm law resistor chain $R_Q$~$R_1$ and $R_\theta$ divides a voltage 0~$V_P$ into Q+1 segments, forming Q+2 potential points. Except 0 and $V_P$, $V_{Q-1}$~$V_\theta$ are reference potential points, or quantized points, which have $Q=2^q$ steps. The reference potential chain $V_{Q-1}$~$V_\theta$ are set as the logarithm law; $V_{Q-1}$~$V_1$ are connected to inverting terminals of correspondent first-stage comparators $C_{Q-1}$~$C_1$, and a first-stage to-be-compared voltage $U_{\alpha Z}$ is connected to non-inverting terminals of each first-stage comparator, so as to generate first-stage comparison values $I_{Q-1}$~$I_1$; Through encoding the first-stage comparison values by a first-stage encoder BM, first-stage logarithmic digital output signals $D_{q-1}$~$D_0$ are generated. A stage-potential $V_G$ of the to-be-compared voltage $U_{\alpha Z}$ is obtained by controlling a stage-potential switch JDWKG via the first-stage comparison values $I_{Q-1}$~$I_1$ or the digital output signals $D_{q-1}$~$D_0$, namely obtaining a rough result of $U_{\alpha Z}$ about a detection to that which segments of the first-stage-potential chains the to-be-compared voltage $U_{\alpha Z}$ belongs. The to-be-compared voltage $U_{\alpha Z}$ is connected to first-stage summators $\Sigma_{Q-1}$~$\Sigma_0$ to be minuends, and the reference potential points $V_{Q-1}$~$V_\theta$ are correspondingly connected to $\Sigma_{Q-1}$~$\Sigma_0$ to be subtrahends, so as to generated difference voltages $U_{X(Q-1)}$~$U_{X0}$. Then, the difference voltages $U_{X(Q-1)}$~$U_{X0}$ are sent into first-stage amplifiers $F_{Q-1}$~$F_0$ to generate operational voltages $U_{y(Q-1)}$~$U_{y0}$. The difference voltage correspondent to the stage-potential $V_G$ is called a residue voltage $U_{XG}$ which is unshown because of a random position of $U_{XG}$. The operational voltage correspondent to the stage-potential $V_G$ is called an operational stage-potential $U_{yG}$. The summators acquires that the residue voltage $U_{XG}=U_{\alpha Z}-V_G$ and that $U_{XG}$ ranges within (0~$\Delta V_G$), wherein $\Delta V_G$ is a quantization distance of the stage-potential; $\Delta V_G=(V_{(G+1)}-V_G)$. Let an amplification coefficient of the amplifier $F_G$ be $V_p/\Delta V_G$, the amplifier $F_G$ generates the operational stage voltage $U_{yG}=U_{XG}*V_p/\Delta V_G$. After $U_{XG}$ is amplified into $U_{yG}$, the voltage range expands into a full scale of 0~$V_p$. The stage-potential switch extracts out the operational stage voltage $U_{yG}$ and sends the extracted $U_{yG}$ into a switch main line $S_\alpha$ towards the next stage. $U_{yG}$ becomes the to-be-compared voltage at the next stage $U_{\beta Z}$ after being sampled and held by a sampler/holder $CB_\beta$, before an accurate measurement at the next stage. The input voltages of the two sub-stages maintain independent and stable within a sampling cycle due to the inter-stage sampler/holder $CB_\beta$, in such a manner that the two sub-stages are capable of parallel operating and form a pipe-line-type conversion.

The second-stage $LAD\#_\beta$ mainly comprises a second-stage logarithmic chain parallelizer $LBXQ_\beta$, wherein second-stage logarithmic resistor chain $R'_T \sim R'_1$ form potential points $V_P$ and $V'_{T-1} \sim V'_0$. Except $V_P$, $V'_{T-1} \sim V'_0$ are second-stage logarithmic reference potential points. $V'_{T-1} \sim V'_1$ are connected to correspondent inverting terminals of second-stage comparators $C'_{T-1} \sim C'_1$, and the second-stage to-be-compared voltage $U_{\beta Z}$ is connected to a non-inverting terminal of each second-stage comparator, so as to generate second-stage comparison values $I'_{T-1} \sim I'_1$. Then the second-stage comparison values $I'_{T-1} \sim I'_1$ are encoded by a second-stage encoder BM' to generate second-stage logarithm law digital signals $D'_{t-1} \sim D'_0$. The two sub-stages, $LAD\#_\alpha$ and $LAD\#_\beta$, together accomplish the digital signals conversion of the q+t bits logarithm law, wherein $D_{q-1} \sim D_0$ are high bit and $D'_{t-1} \sim D'_0$ are low bit.

In order to increase an SNR and broaden a signal dynamic range, the logarithmic resistor chain is preferred. The resistor chains of the two sub-stages, $LAD\#_\alpha$ and $LAD\#_\beta$ are set according to the logarithm law as follows.

The first-stage resistor chain is logarithmically provided as follows. The resistor chain of $LAD\#_\alpha$ has a constant resistance, so a chain current $I_\alpha$ is also constant. Let a base potential $V_\theta$ be equal to a minimum effective detection value of a sensor, and let a base resistance $R_\theta = V_\theta/I_\alpha$ and $R_A/R_\theta = \eta - 1$, wherein $R_A$ is a virtual start resistance, the first-stage chain resistances successively increase by a large ratio of $\eta^T$ from $R_A$, which forms a large ratio resistor chain: $R_1 = R_A*\eta^T$, $R_2 = R_A*\eta^{2*T}$, ..., $R_{Q-3} = R_A*\eta^{(Q-3)*T}$, $R_{Q-2} = R_A*\eta^{(Q-2)*T}$, $R_{Q-1} = R_A*\eta^{(Q-1)*T}$. The large ratio resistor chain $R_\theta \sim R_Q$ forms a large ratio potential chain $(V_{j+1}/V_j = \eta^T)$: ground, $V_\theta$, $V_1 = V_\theta*\eta^T$, $V_2 = V_\theta*\eta^{2*T}$, $V_3 = V_\theta*\eta^{3*T}$, ..., $V_{Q-2} = V_\theta*\eta^{(Q-2)*T}$, $V_{Q-1} = V_\theta*\eta^{(Q-1)*T}$, $V_Q = V_\theta*\eta^{Q*T} = V_P$. Except $V_Q = V_P$, Q reference potential points, also called quantized points, are: $V_\theta, V_1, \ldots, V_{Q-1}$. Because a region below $V_\theta$ is an invalid detection region of the sensor, $V_\theta$ is the quantized point of the region of $(V_1 \sim V_\theta \sim 0)$ which is marked as $(V_1 \sim V_\theta \sim 0) \rightarrow V_\theta$; quantization intervals of the other quantized points are: $(V_2 \sim V_1] \rightarrow V_1$, $(V_3 \sim V_2] \rightarrow V_2$, ..., $(V_{Q-1} \sim V_{Q-2}] \rightarrow V_{Q-2}$, $(V_Q \sim V_{Q-1}] \rightarrow V_{Q-1}$. Since the first-stage quantized points are rough because of the large ratio $\eta^T$, it is necessary to insert T second-stage fine quantized points having a small ratio of $\eta$ therebetween.

The second-stage resistor chain is logarithmically provided as follows. The resistor chain of $LAD\#_\beta$ comprises $T = 2^t$ resistors, $R'_1 \sim R'_T$. As illustrated above of the first sub-stage, the residue voltage $U_{XG} = U_{\alpha Z} - V_G$ ranges within $(0 \sim \Delta V_G)$; $\Delta V_G = (V_{(G+1)} - V_G)$; $V_G = V_\theta*\eta^{G*T}$, $V_{(G+1)} = V_\theta*\eta^{(G+1)*T}$, wherein $\Delta V_G$ is the quantization step of the first-stage stage-potential $V_G$. Theoretically, T fine quantized points of the second sub-stage need to be inserted into $V_G \sim V_{(G+1)}$; the fine quantized points of $V_G \sim V_{(G+1)}$ comprise $V''_0 = V_G = V_\theta*\eta^{G*T}$, $V''_1 = V_G*\eta^1$, $V''_2 = V_G*\eta^2$, $V''_3 = V_G*\eta^3$, ..., $V''_{T-2} = V_G*\eta^{T-2}$, $V''_{T-1} = V_G*\eta^{T-1}$, wherein the fine quantized points increase geometrically by a ratio of $\eta$. $V''_T = V_G*\eta^T = V_{G+1}$ is the quantized point at first-stage next step, and thus excluded from the inserted points. Thus once the second-stage resistor chain has the geometrical relation of $\eta$ and is multiplied by a coefficient, the second-stage resistor chain is capable of accomplishing the logarithmic conversion of the residue voltage. Actually, the second-stage conversion is extracting out the first-stage residue voltage $U_{XG}$, rather than inserting the fine quantized points into $V_G \sim V_{(G+1)}$. $U_{XG}$ ranges within $(0 \sim \Delta V_G)$; the first-stage residue voltage $U_{XG}$ expands into the first-stage operational stage voltage $U_{yG}$ after being amplified by the correspondent amplifier $F_G$. Let the amplification coefficient of the amplifier $F_G$ be $V_p/\Delta V_G$, $U_{yG} = U_{XG}*V_p/\Delta V_G$, and the range of $(0 \sim \Delta V_G)$ is expanded into the full scale of $0 \sim V_p$. The operational stage voltage $U_{yG}$ becomes the second-stage to-be-compared voltage $U_{\beta Z}$ after being sampled and held by the sampler/holder $CB_\beta$. It is a key of the second-stage resistor chain to establish the logarithm law quantized points. In the second-stage resistor chain, $R_B$ is an arbitrary virtual resistance, values of T chain resistors increase geometrically by the ratio of $\eta: R'_1$, $R'_B*\eta^1$, $R'_2 = R_B*\eta^2$, $R'_3 = R_B*\eta^3$, ..., $R'_{T-2} = R_B*\eta^{T-2}$, $R'_{T-1} = R_B*\eta^{T-1}$, $R'_T = R_B*\eta^T$, and then naturally T quantized points whose potentials geometrically increase by the ratio of $\eta$ are formed: 0, $V'_1 = V_B*\eta^1$, $V'_2 = V_B*\eta^2$, $V'_3 = V_B*\eta^3$, ..., $V'_{T-2} = V_B*\eta^{(T-2)}$, $V'_{T-1} = V_B*\eta^{(T-1)}$, as well as the quantization intervals thereof: $(V'_1 \sim 0] \rightarrow 0$, $(V'_2 \sim V'_1] \rightarrow V'_1$, $(V'_3 \sim V'_2] \rightarrow V'_2$, ..., $(V'_{T-1} \sim V'_{T-2}] \rightarrow V'_{T-2}$, $(V'_T \sim V'_{T-1}] \rightarrow V'_{T-1}$. $V'_T = V_P$ is excluded from the second-stage quantized points.

Herein, the two-stage logarithmic chain ADC converts the analog signals into the logarithmic digital signals. As showed in FIG. 1.3, a curve 3 represents the constant SNR of the digital signals. Further, if the base resistance $R_\theta$ is adjusted into an adjustment resistance $R*_\theta$, wherein $R*_\theta = R_\theta \sim R_\theta/15$, let $R*_\theta$ be the minimal effective signal of the sensor, by reducing the adjustment resistance $R*_\theta$, showed as a curve 4 in FIG. 1.3, the SNR curve decreases at a small signal section, while the dynamic range expands.

Embodiment 5.1

Two-Stage Logarithmic Chain DAC

A resistor chain and a reference potential chain of the DAC are in a logarithmic relation. The logarithm law digital signals received by the DAC are high bit $D_{q-1} \sim D_0$, and low bit $D'_{t-1} \sim D'_0$. The high bit $D_{q-1} \sim D_0$ are correspondingly sent into control terminals $d_{q-1} \sim d_0$ of a first-stage multi-channel switch, so as to generate a first-stage stage-potential $V_G$. The low bit $D'_{t-1} \sim D'_0$ are correspondingly sent into control terminals $d'_{t-1} \sim d'_0$ of a second-stage multi-channel switch, so as to generate a second-stage stage-potential $V'_B$. Let b equal to some point within $(0 \sim T-1)$, $V'_b$ is called a reference potential point at second-stage step b, wherein a strobe potential point is the second-stage stage-potential $V'_B$. According to Embodiment 5.1 of the present invention, the two-stage logarithmic chain DAC comprises a lossless switch.

$LDA\#_\beta$ comprises $DZL_\beta$, $JDWKG'$ and $\Sigma_{\beta U}$. $DZL_\beta$, a second-stage logarithmic resistor chain, comprises a second-stage logarithmic resistor chain $R'_T \sim R'_1$, and second-stage logarithmic reference potential points $V'_{T-1} \sim V'_0$. The second-stage resistor chain is logarithmically provided as illustrated in Embodiment 4.1 of the present invention.

The second-stage resistor chain forms the T reference potential points $V'_{T-1}, V'_{T-2}, \ldots, V'_1, V'_0$, and quantization intervals thereof $(V'_1 \sim 0] \rightarrow V'_0$, $(V'_2 \sim V'_1] \rightarrow V'_1$, $(V'_3 \sim V'_2] \rightarrow V'_2$, ..., $(V'_{T-1} \sim V'_{T-2}] \rightarrow V'_{T-2}$, $(V'_T \sim V'T_{-1}] \rightarrow V'_{T-1}$. A quantization step, or a step difference of $V'_b$, $\Delta V'_b = V'_{b+1} - V'_b$. After the control terminals $d'_{t-1} \sim d'_0$ of the second-stage stage-potential switch $JDWKG'$ receive the low bit digital signals $D'_{t-1} \sim D'_0$, a strobe point $S'_b$ is determined among second-stage switch points $S'_{T-1} \sim S'_0$ and specially marked as $S'_B$. The potential point $V'_b$ correspondent to the strobe point $S'_B$ is a second-stage stage-potential $V_{\beta B}$. The second-stage stage-potential $V_{\beta B}$ ranges within the T potential points $V'_0, V'_1, \ldots, V'_{T-2}, V'_{T-1}$ whose quantization intervals respectively are: $(V'_1 \sim V'_0] \rightarrow V'_0$, $(V'_2 \sim V'_1] \rightarrow V'_1$, $(V'_3 \sim V'_2] \rightarrow V'_2, \ldots, (V'_{T-1} \sim V'_{T-2}] \rightarrow V'_{T-2}$, $(V'_T \sim V'_{T-1}] \rightarrow V'_{T-1}$, so an analog voltage correspondent to the second-stage stage-potential $V_{\beta B}$ ranges within $0 \sim V_P$.

LDA#$_\alpha$ comprises DZL$_\alpha$, SJQH, JDWKG, and $\Sigma_{AU}$. DZL$_\alpha$, a first-stage logarithmic resistor chain, comprises a first-stage logarithmic resistor chain $R_Q \sim R_1$ and $R_\theta$, and first-stage logarithmic reference potential points $V_{Q-1} \sim V_\theta$. The first-stage resistor chain is logarithmically provided as illustrated in the Embodiment 4.1 of the present invention. Let g be an arbitrary one of $0 \sim (Q-1)$, each first-stage-potential point $V_g$ is correspondently connected to an summator $\Sigma_g$, an attenuator $\Psi_g$ and a switch point $S_g$, so as to form a branch g. The voltage between the potential point $V_g$ and the potential point $V_{g+1}$ is called a step difference $\Delta V_g$ of the potential point $V_g$, wherein $\Delta V_g = V_{g+1} - V_g$.

As the residue voltage of the stage-potential $V_G$, the second-stage stage-potential $V_{\beta B}$ is summed with the first-stage stage-potential $V_G$. It is worth to mention that the analog voltage correspondent to the second-stage stage-potential $V_{\beta B}$ ranges within $0 \sim V_P$, but the analog voltage is supposed to reasonably range within $0 \sim \Delta V_G$. Thus, correspondent to the potential at step g, the range $0 \sim V_P$ of $V_{\beta B}$ needs to be attenuated into $0 \sim \Delta V_g$, which requires the attenuator $\Psi_g$. It is also worth to mention that $\Delta V_g$ at each step is unequal, but geometric. Thus an attenuation coefficient $\psi_g$ in lower case of the attenuator $\Psi_g$ in upper case at each step are also geometric. Let $\psi_g = \Delta V_g / V_P$, the second-stage stage-potential $V_{\beta B}$ is changed into an attenuated value $V_{\Psi g}$ based on an attenuation calculation of $V_{\Psi g} = V_{\beta B} * \psi_g = V_{\beta B} * \Delta V_g / V_P$, in such a manner that the voltage range $0 \sim V_P$ of $V_{\beta B}$ is attenuated into the range $0 \sim \Delta V_g$ of $V_{\Psi g}$. $V_{\Psi g}$ is the residue voltage at step g of the first-stage reference potential points $V_{Q-1} \sim V_\theta$ before becoming the strobe point. The first-stage reference potential $V_g$ is a rough analog value, while the correspondent attenuated voltage $V_{\Psi g}$ as the residue voltage of $V_g$ is a fine analog value. $V_g$ is summed with $V_{\Psi g}$ through the summator $\Sigma_g$, so as to generate a sum of the first-stage rough analog value $V_g$ and the second-stage fine analog value $V_{\Psi g}$. The sum thereof is called a reference potential sum value $V_{\Sigma g}$. Each first-stage reference potential $V_g$ has a correspondent reference potential sum value $V_{\Sigma g}$ to be outputted. After the control terminals $d_{q-1} \sim d_0$ of the first-stage stage-potential switch JDWKG receive the high bit digital signals $D_{q-1} \sim D_0$, a first-stage strobe point $S_G$ is determined, and then the reference potential sum value $V_{\Sigma g}$ correspondent to the first-stage strobe point is outputted as a stage-potential sum value $V_{\Sigma G}$ into a collector $\Sigma_{\alpha U}$. Actually, the collector $\Sigma_{\alpha U}$ only receives the single stage-potential sum value $U_{\Sigma G}$ which is outputted in a form of a DA conversion value $U_{\alpha \beta}$. Herein, the two-stage logarithmic chain DAC finishes the conversion.

It is puzzling to calculate the anti-logarithm through the logarithm chain. However, the analog signal is converted into the digital signal through the logarithm chain, and then the intact digital signal is converted through identically structured logarithm chain and naturally recovers into the original analog signal. For example, $U_{\alpha \nu} = V'_3$ is converted by the logarithm chain ADC into $D_2 D_1 D_0 = 000$ and $D'_3 D'_2 D'_1 D'_0 = 0011$; then $D_2 D_1 D_0$ and $D'_3 D'_2 D'_1 D'_0$ are recovered by the logarithm chain DAC into $V'_3$. Actually, a reverse of logarithm-anti-logarithm is accomplished through a reverse of AD-DA.

Embodiment 5.2

Two-Stage Logarithmic Chain DAC with Half-Step Quantization Points

Based on Embodiment 5.1 of the present invention, the DAC of Embodiment 5.2 further comprises a half-step quantization of the reference potential points. According to Embodiment 5.2 of the present invention, the reference potential points of the DAC are the half-step quantization points as illustrated in the theoretical analysis. Half-step reference points are formed by moving all of the reference potential points a half step up; half-step resistance are formed by moving all of the resistance the half step up; $U_g$ represents a first-stage half-step reference point; $P_g$ represents a first-stage half-step resistance; $U'_b$ represents a second-stage half-step reference point; $P'_b$ represents a second-stage half-step resistance. A correspondence between a resistor chain of the DAC in Embodiment 5.2 and the resistor chain of the DAC in Embodiment 5.1 is $U_g \rightarrow V_g$, $P_g \rightarrow R_g$, $U'_b \rightarrow V'_b$, $P'_b \rightarrow R'_b$. The half-step means moving the original reference potential points the half step up, calculated as follows.

Moving all the reference potential points the half step up generates the first-stage half-step reference point $U_g = (V_g + V_g * \eta)/2$, the first-stage half-step resistance $P_g = (R_g + R_g * \eta)/2$, the second-stage half-step reference points $U'_b = (V'_b + V'_b * \eta)/2$, and the second-stage half-step resistance $P'_b = (R'_b + R'_b * \eta)/2$, so as to accomplish moving all of the reference potential points and the resistance the half step up.

Through the half-step processing, the two-stage logarithmic chain DAC is changed into the two-stage logarithmic chain DAC with the half-step quantization points. After the half-step processing of the reference potential points, the quantization step is shortened by a half, which decreases a quantization error by ¾ and increase $[S_J/N_J]_{dB}$ by 10 log $4 = 6.02$ dB.

Embodiment 6.1

Digital Logarithmic Converter

A linear analog signal is firstly converted into an N-bit logarithm law digital signal by the two-stage N-bit logarithmic chain ADC as illustrated in Embodiment 4.1, and then converted into an output analog signal by a N-bit linear DAC. The output analog signal is an analog signal based on a logarithm law.

Embodiment 6.2

Digital Anti-Logarithmic Converter

An analog signal based on a logarithm law is firstly converted into an N-bit logarithm law digital signal by an N-bit linear ADC, and then converted into an output analog signal by an N-bit two-stage logarithmic chain DAC. The output analog signal is a linear analog signal. The N-bit two-stage logarithmic chain DAC is as illustrated in Embodiment 5.1 of the present invention.

Embodiment 7.1

Logarithm Chain ADC Having at Least Three Sub-Stages

Similar to the two-stage logarithm chain ADC, the logarithm chain ADC having at least three sub-stages comprises the second sub-stage as the final stage, and further comprises one or more than one intermediate sub-stage which has an identical structure to the first sub-stage, such as a first intermediate sub-stage, a second intermediate sub-stage and a third intermediate sub-stage.

Embodiment 7.2

Logarithm Chain DAC Having at Least Three Sub-Stages

Similar to the two-stage logarithm chain DAC, the logarithm chain DAC having at least three sub-stages further comprises at least one added sub-stage which is identical to the second sub-stage. The added sub-stage comprises a resistor chain, a stage-potential switch and a correspondent attenuator group.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. Multi-stage parallel super-high-speed ADC and DAC of a logarithmic companding law, wherein the logarithmic ADDA comprises multi-sub-ADDAs, wherein at least one sub-ADDA comprises a stage-potential processing device, wherein the stage-potential processing device at stage $\lambda$ comprising:

a stage-potential generating module at stage $\lambda$ which comprises a resistor chain for generating reference potential points and a potential stage determining circuit, wherein let $Q=2^q$, the q-bit reference potential points of the sub-ADDA at stage $\lambda$ are formed by series connected Q resistors; the resistor chain of the series connected Q resistors provides Q+1 potential points $V_{\lambda,Q}, V_{\lambda(Q-1)} \cdots V_{\lambda,1}, V_{\lambda,0}$, among which $V_{\lambda(Q-1)} \cdots V_{\lambda,1}, V_{\lambda,0}$ are the Q step reference potential points at stage $\lambda$, wherein $V_{\lambda,Q}$ is equal to a power source anode $V_p$, and is excluded from the reference potential at step Q; let g be equal to some point whose subscript is within (0~Q-1), point g is called a test point, and $V_{\lambda g}$ is the reference potential at step g stage $\lambda$; a quantization distance (also called a step difference) $\Delta_{\lambda g} = V_{\lambda(g+1)} - V_{\lambda g}$; when a to-be-compared voltage $U_{\lambda Z}$ falls within a conversion range $V_{\lambda,Q} \sim 0$, there is always a point G correspondent to $U_{\lambda Z}$, wherein, when $g=G$, $V_{\lambda(G+1)} > U_{\lambda Z} > V_{\lambda G}$ and $U_{\lambda Z} - V_{\lambda G} < \Delta_{\lambda G}$; particularly, point G is named as a stage point, and $V_{\lambda g}$ at the stage point G is the reference point which is smaller than and closest to $U_{\lambda Z}$; $V_{\lambda g}$ is a special reference point among the reference points $V_{\lambda(Q-1)} - V_{\lambda,0}$, especially marked as $V_{\lambda G}$; $V_{\lambda G}$ is called a stage-potential at stage $\lambda$; relative to the sub-ADDA at stage $\lambda$, the stage-potential $V_{\lambda G}$ is a conversion value of $U_{\lambda Z}$;

a stage-potential extracting module, wherein, for the sub-ADDA at stage $\lambda$, although it can be determined that which of the reference potential points $V_{\lambda(Q-1)} \sim V_{\lambda,0}$ is the stage-potential $V_{\lambda G}$, the stage-potential $V_{\lambda G}$ still remains to be extracted, which requires the stage-potential extracting module; the stage-potential extracting module is a stage-potential switch; a group of threshold switches forms the stage-potential switch; the stage-potential switch $JDWKG_\lambda$ comprises a threshold switch group $LJKGZ_\lambda$ and a multi-channel switch $DLKG_\lambda$, wherein the threshold switch group is the group of the threshold switches whose output terminals are parallel connected into a common terminal and whose input terminals form an input terminal group of the threshold switch group; control characters are provided for directly choosing and connecting one of the input terminals as a strobe terminal; the threshold switch point $S_{\lambda g}$ at step g stage $\lambda$ has an upper control character $I_{\lambda(g+1)}$ and a lower control character $I_{\lambda g}$ which are respectively connected to and equal to potential comparison values $I^*_{\lambda(g+1)}$ and $I^*_{\lambda g}$; when $I_{\lambda(g+1)}=1$ or $I_{\lambda g}=0$, the switch point $S_{\lambda g}$ is open; only when the switch point $S_{\lambda g}$ satisfies requirements of $I_{\lambda(g+1)}=0$ and $I_{\lambda g}=1$, the switch point $S_{\lambda g}$ is connected and becomes a strobe point $S_{\lambda G}$; a potential at the strobe point $S_{\lambda G}$ is $V_{\lambda G}$ at step G stage $\lambda$, and is also called the stage-potential $V_{\lambda G}$ of stage $\lambda$;

wherein the stage-potential $V_{\lambda G}$ is a bridge of A/D conversion and D/A conversion, and corresponds respectively to digital signals $D_{\lambda(q-1)} \sim D_{\lambda,0}$ and the to-be-compared voltage $U_{\lambda Z}$, wherein the correspondence is accomplished via a correspondence between the reference points $V_{\lambda(Q-1)} \sim V_{\lambda,0}$ and the control characters $I_{\lambda(Q-1)} \sim I_{\lambda,0}$, and a correspondence between the reference points $V_{\lambda(Q-1)} \sim V_{\lambda,0}$ and the threshold switch group $S_{\lambda(Q-1)} \sim S_{\lambda,0}$; the stage-potential $V_{\lambda G}$ is a threshold point among the reference points $V_{\lambda(Q-1)} \sim V_{\lambda,0}$, and is determined through values of the control characters $I_{\lambda(Q-1)} \sim I_{\lambda,0}$ and the strobe terminal of the threshold switch group $S_{\lambda(Q-1)} \sim S_{\lambda,0}$;

wherein the stage-potential $V_{\lambda G}$ is obtained through the correspondence between the reference points $V_{\lambda(Q-1)} \sim V_{\lambda,0}$ and the control characters $I_{\lambda(Q-1)} \sim I_{\lambda,0}$, and the correspondence between the reference points $V_{\lambda(Q-1)} \sim V_{\lambda,0}$ and the switch group $S_{\lambda(Q-1)} \sim S_{\lambda,0}$; wherein firstly, the correspondence between $V_{\lambda(Q-1)} \sim V_{\lambda,0}$ and the digital signals, or the correspondence between $V_{\lambda(Q-1)} \sim V_{\lambda,0}$ and the control characters $I_{\lambda(Q-1)} \sim I_{\lambda,0}$ is illustrated as follows; among the reference points $V_{\lambda(Q-1)} \sim V_{\lambda,0}$, $V_{\lambda G}$ is the threshold point, when the to-be-compared voltage at stage $\lambda$ $U_{\lambda Z} > (V_{\lambda G} \sim V_{\lambda,0})$, the control characters $I_{\lambda G} \sim I_{\lambda,0}$ correspondent to the reference points $V_{\lambda G} \sim V_{\lambda,0}$ are equal to 1; in other words, each threshold switch $(S_{\lambda(G-1)} \sim S_{\lambda,0})$ connected below $V_{\lambda G}$ has the control character $I_{\lambda(g+1)} = I_{\lambda g} = 1$, so $(S_{\lambda(G-1)} \sim S_{\lambda,0})$ are at states of OFF; when $U_{\lambda Z} < (V_{\lambda,Q} \sim V_{\lambda(G+1)})$, the control characters $I_{\lambda,Q} \sim I_{\lambda(G+1)}$ correspondent to the reference points $V_{\lambda,Q} \sim V_{\lambda(G+1)}$ are equal to zero; in other words, each threshold switch $(S_{\lambda(G+1)} \sim S_{\lambda(Q-1)})$ connected above $V_{\lambda G}$ has the control character $I_{\lambda(g+1)} = I_{\lambda g} = 0$, so $(S_{\lambda(G+1)} \sim S_{\lambda(Q-1)})$ are also at states of OFF; only when the threshold switch $S_{\lambda G}$ at the threshold point has the control characters $I_{\lambda(G+1)} = 0$ and $I_{\lambda G} = 1$, $S_{\lambda G}$ is at a state of ON; and secondly, $V_{\lambda(Q-1)} \sim V_{\lambda,0}$ and the correspondent $S_{\lambda(Q-1)} \sim S_{\lambda,0}$ are connected directly, or correspondently via an arithmetic circuit; the strobe point $S_{\lambda G}$ among $S_{\lambda(Q-1)} \sim S_{\lambda,0}$ extracts out the stage-potential $V_{\lambda G}$, and sends the extracted stage-potential $V_{\lambda G}$ into a main line $S_\lambda$ of the stage-potential switch; the sent stage-potential $V_{\lambda G}$ and the stage output values of other sub-ADDAs are collected and calculated, for accomplishing the A/D and D/A conversions; the stage-potential $V_{\lambda G}$ is the reference point potential closest to the to-be-compared voltage $U_{\lambda Z}$; $V_{\lambda G}$ and $U_{\lambda Z}$ have a relation of $V_{\lambda G}=U_{\lambda Z}-U_{\lambda x}$, wherein $U_{\lambda x}$ is a residue voltage which is smaller than a span of the reference point voltage; and wherein the threshold switch comprises a lossy switch and a lossless switch, wherein the lossless switch comprises a voltage follower switch which functions as a signal switch for transmitting or blocking signals, wherein the voltage follower switch comprises two modules, a module of a voltage follower and a module of a power source switch; the power source switch is an electronic device provided on a power source loop of the follower; connection and disconnection of the power source loop of the follower are controlled by the power source switch through the control characters, so as to control connection and disconnection of a signal loop of the follower.

2. A lossless switch based on a follower switch, wherein the follower switch of the lossless switch functions as a signal switch for transmitting or blocking signals; the follower switch comprises two modules, a follower and a power source switch, wherein the power source switch is an electronic device provided on a power source loop of the follower, and controls connection and disconnection of the power source loop of the follower through control characters; and wherein the follower is at a state of following voltage when the power source loop is connected; herein the signal is inputted through a non-inverting terminal of the follower, and a voltage of an output terminal is accurately equal to a voltage of the non-inverting terminal, in such a manner that the signal is on; the follower cuts off the signal when the power source loop is disconnected; the follower switch controls the connection and disconnection of the power source loop through the control characters, so as to further control connection and disconnection of a signal loop of the follower; logic relations about the connection and disconnection of the follower switch formed by the control characters is arbitrary, comprising normally open, normally close and threshold switching; preferably, the follower switch is a threshold switch having the logic relations; the threshold switch $S_{\lambda g}$ comprises $S_{\lambda g1}$, $S_{\lambda g2}$ and $S_{\lambda g3}$.

3. The lossless switch based on a follower switch, as recited in claim 2, wherein the lossless switch $S_{\lambda g}$ is transformed from the follower switch by establishing a control logic of the power source switch; the logic comprises:

when $I_{\lambda g}=0$ or $I_{\lambda(g+1)}=1$, $S_{\lambda g}$ is signal off; only when $I_{\lambda g}=1$ and $I_{\lambda(g+1)}=0$, $A_{\lambda g}$ is powered on only by closing KS1 and KS3 which are power source switches conducting at high potential and closing KS0 and KS2 which are power source switches conducting at low potential, in such manner that $A_{\lambda g}$ is signal on; otherwise, once $I_{\lambda g}=0$ or $I_{\lambda(g+1)}=1$, KS1 and KS3 are cutting off, or, KS0 and KS2 are cutting off, in such a manner that $A_{\lambda g}$ is powered off and thus signal-off; for simplification, one of KS0 and KS2 is arbitrarily in short circuit; one of KS1 and KS3 is arbitrarily in short circuit.

4. The multi-stage parallel super-high-speed ADC and DAC of the logarithmic companding law, as recited in claim 1, wherein an m stages*q-bit equal resistance logarithmic ADC is established as follows, wherein after being processed by a front-end circuit QZDL, an original input alternating signal $u_{\alpha y}$ becomes an input voltage at stage α $U_{\alpha y}$; an input voltage $U_{\lambda y}$ at stage λ ranges between $0\sim V_p$; AD#$_\lambda$ at stage λ processes the input voltage $U_{\lambda y}$ at stage λ with an AD conversion through following five modules and processes thereof:

(1) a stage-potential $V_{\lambda G}$ generating module, wherein, let $Q=2^q$, a voltage-dividing resistor chain of a parallelizer at stage λ $R_{\lambda(Q-1)}\sim R_{\lambda 0}$ forms potential reference points $V_{\lambda(Q-1)}\sim V_{\lambda 0}$ at stage λ, wherein $V_{\lambda 0}$ is a bottom potential; the reference points $V_{\lambda(Q-1)}\sim V_{\lambda 1}$ are correspondently connected to inverting terminals of comparators $C_{\lambda(Q-1)}\sim C_{\lambda 1}$ in the parallelizer; the input voltage at stage λ $U_{\lambda y}$ becomes a temporarily stable voltage $U^*_{\lambda y}$ through sampling and holding; then summing the bottom potential $V_{\lambda 0}$ and the temporarily stable voltage $U^*_{\lambda y}$ forms a to-be-compared voltage $U_{\lambda Z}$; the to-be-compared voltage $U_{\lambda Z}$ is connected to non-inverting terminals of the comparators $C_{\lambda(Q-1)}\sim C_{\lambda 1}$, and compared with the potential reference points $V_{\lambda(Q-1)}\sim V_{\lambda 0}$, so as to generate the stage-potential $V_{\lambda G}$; through $V_{\lambda(G+1)}>U_{\lambda Z}>V_{\lambda G}$, a threshold point G of comparison values $I_{\lambda(Q-1)}\sim I_{\lambda 1}$ at stage λ satisfying requirements of $I_{\lambda(Q-1)}\sim I_{\lambda(G+1)}=0$ and $I_{\lambda G}\sim I_{\lambda 1}=1$ is determined; let $I_{\lambda Q}$ constantly 0 and $I_{\lambda 0}$ constantly 1, the comparison values $I_{\lambda(Q-1)}\sim I_{\lambda 0}$ are encoded by an encoder $BM_\lambda$, and then digital output values $D_{\lambda(q-1)}\sim D_{\lambda 0}$ of the stage-potential $V_{\lambda G}$ are obtained; herein, with the stage-potential $V_{\lambda G}$ as a bridge, the to-be-compared $U_{\lambda Z}$ is converted into the stage-potential $V_{\lambda G}$ and further into the digital signals $D_{\lambda(q-1)}\sim D_{\lambda 0}$;

(2) a switch error reducing module which reduces switch errors by applying identical elevation to the potential of the reference points and the input voltage, or through a lossless switch;

(3) a stage-potential $V_{\lambda G}$ extracting module, wherein all sub-stages in AD## needs to extract out the stage-potential $V_{\lambda G}$ for a preparation of the conversion at next sub-stage, except the final sub-stage; the stage-potential is extracted for the conversion at next sub-stage; given that a conversion bit number of each sub-stage is q, $Q=2^q$, the voltage $V_p$ is divided by the resistor chain into Q equal voltages $\Delta V$; each $\Delta V$ is a fixed value $\Delta V=V_p/Q$; the reference potential points $V_{\lambda(Q-1)}\sim V_{\lambda 0}$ are arithmetically connected to the switch points $S_{\lambda(Q-1)}\sim S_{\lambda 0}$ one by one; a strobe point $S_{\lambda G}$ is determined through a strobe control of the threshold switch group; the strobe point $S_{\lambda G}$ corresponds to the stage-potential $V_{\lambda G}$, and sends the stage-potential $V_{\lambda G}$ into a switch main line $S_\lambda$;

(4) an inter-stage operation module, comprising a sampler/holder $CB_\lambda$, a residue summator $\Sigma_\lambda$ and a residue amplifier $FD_\lambda$, wherein the input voltage $U_{\lambda y}$ at stage λ becomes the stable $U^*_{\lambda y}$ through the sampler/holder $CB_\lambda$, in such a manner that the m sub-stages are able to run parallel; the residue summator $\Sigma_\lambda$ generates a residue voltage $U_{\lambda x}=U_{\lambda Z}-V'_{\lambda G}-V_{\lambda S}$; the residue voltage $U_{\lambda x}$ is within $0\sim\Delta V$; the residue amplifier $FD_\lambda$ amplifies a residue voltage signal Q times, so as to generate $U_{(\lambda+1)y}=U_{\mu y}=Q*U_{\lambda x}$; as a result, a range of $U_{\mu y}$ expands into a full scale of $0\sim V_p$, and $U_{\mu y}$ becomes the input voltage at stage μ; the input voltage $U_{\mu y}$ at stage μ enters AD#$_\mu$ at stage μ for measurement and conversion at a higher accuracy; and (5) a logarithmic conversion module and a process thereof comprising an analog conversion and a digital conversion, wherein the digital conversion is based on converting an overall input voltage Uαy into high-bit digital signals having equal quantization distances, and then converting the high-bit digital signals into low-bit digital signals having logarithmic quantization distances through a logarithm table; the analog conversion is based on converting a linear input voltage into the logarithmic input voltage through an analog logarithm converter before inputting into stage α, while actually ADC is for converting the logarithmic input voltage into the digital signals having the logarithmic quantization distances.

5. The multi-stage parallel super-high-speed ADC and DAC of the logarithmic companding law, as recited in claim 1, wherein an m stages*q-bit equal resistance logarithmic DAC is established as follows, wherein N-bit digital signals are allocated as m stages*q-bit: $(D_{(N-1)}), \ldots, D_0) = (D_{\alpha(q-1)}, \ldots, D_{\alpha 0}), (D_{\beta(q-1)}, \ldots, D_{\beta 0}), \ldots, (D_{m(q-1)}, \ldots, D_{m0})$; D are sent into control terminals of correspondent stage-potential switches: $(d_{\alpha(q-1)}, \ldots, d_{\alpha 0}), (d_{\beta(q-1)}, \ldots, d_{\beta 0}), \ldots, (d_{m(q-1)}, \ldots, d_{m0})$; the sub-$DAC_\lambda$ at stage $\lambda$ processes the digital signals at stage $\lambda$ $(D_{\lambda(q-1)}, \ldots, D_{\lambda 0})$ with a DA conversion through following four modules and processes thereof:

(1) a stage-potential $V_{\lambda G}$ generating module, wherein $Q=2^q$; a voltage-dividing resistor chain $R_{\lambda Q}\sim R_{\lambda 0}$ of a parallelizer at stage $\lambda$ forms potential reference points $V_{\lambda(Q-1)}\sim V_{\lambda 0}$ at stage $\lambda$; after the stage-potential $V_{\lambda G}$ generating module receives the digital signals $(D_{\lambda(q-1)}, \ldots, D_{\lambda 0})$, the reference potential point $V_{\lambda G}$ correspondent to the digital signals becomes a stage-potential; $V_{\lambda 0}$ is a bottom potential;

(2) a switch error reducing module, identical to the switch error reducing module of Embodiment 2.1;

(3) a stage-potential $V_{\lambda G}$ extracting module, wherein the stage-potential $V_{\lambda G}$ of each stage needs to be extracted out for calculating an output voltage $V_{\lambda \Psi}$ of each stage; the stage-potential $V_{\lambda G}$ extracting module and a process thereof are identical to the stage-potential $V_{\lambda G}$ extracting module and process in Embodiment 2.1;

(4) an inter-stage operational module, wherein the stage-potential $V_{\lambda G}$, the output voltage $V_{\lambda \Psi}$ and an attenuation coefficient $\Psi_\lambda$ have a relation of: $V_{\lambda \Psi}=V_{\lambda G}/\Psi_\lambda$, wherein $\Psi_\lambda=Q^{(\lambda-1)}$, namely an attenuation coefficient of an attenuator $\Psi_\lambda$ at stage $\lambda$ is $\Psi_\lambda=Q^{(\lambda-1)}$; a summation of $V_{\lambda \Psi}$ of all stages is executed by an overall summator $\Sigma_\Psi$, so as to generate an overall output analog voltage $V_\Psi$; through the attenuator and the overall summator, the bottom potential of each stage becomes equal to a constant $V_{RS}$: $V_{RS}=V_{\alpha 0}/\Psi_\alpha+V_{\beta 0}/\Psi_\beta+\ldots+V_{m0}/\Psi_m=V_{\alpha 0}/(Q^{m-\alpha})+V_{\beta 0}/(Q^{m-\beta})+\ldots+V_{m0}/(Q^{m-m})$; a waveform of the overall output analog voltage $V_\Psi$ is only elevated by $V_{RS}$, without being transformed; the waveform of the overall output analog voltage $V_\Psi$ is obtained by subtracting $V_{RS}$ in the overall summator $\Sigma_\Psi$; and (5) a logarithmic conversion module comprising an analog conversion module and a digital conversion module, wherein the digital conversion module is based on, after receiving low-bit digital signals having logarithmic quantization distances, converting the digital signals into high-bit digital signals having equal quantization distances through an anti-logarithm table, and then converting the high-bit digital signals into analog signals by a high-bit DAC having equal quantization distances; the analog conversion module is based on, after accomplishing the DA conversion by the DAC, converting the logarithmic analog signals into a linear output voltage by an analog anti-logarithmic converter.

6. The multi-stage parallel super-high-speed ADC and DAC of the logarithmic companding law, as recited in claim 1, wherein a two-stage logarithmic chain ADC is establish as follows; the logarithmic chain ADC comprises two sub-stages, $LAD\#_\alpha$ and $LAD\#_\beta$; $LAD\#_\alpha$ is a first-stage logarithmic chain sub-ADC, and $LAD\#_\beta$ is a second-stage logarithmic chain sub-ADC; the two-stage logarithmic chain ADC further comprises a lossless switch; wherein the first-stage $LAD\#_\alpha$ executes a q-bit conversion; a logarithm law resistor chain $R_Q\sim R_1$ and $R_\theta$ divides a voltage $0\sim V_P$ into Q+1 segments, forming Q+2 potential points; except 0 and $V_P$, $V_{Q-1}\sim V_\theta$ are reference potential points, or quantized points, which have $Q=2^q$ steps; the reference potential chain $V_{Q-1}\sim V_\theta$ are set based on the logarithm law; $V_{Q-1}\sim V_1$ are connected to inverting terminals of correspondent first-stage comparators $C_{Q-1}\sim C_1$, and a first-stage to-be-compared voltage $U_{\alpha Z}$ is connected to non-inverting terminals of each first-stage comparator, so as to generate first-stage comparison values $I_{Q-1}\sim I_1$; through encoding the first-stage comparison values by a first-stage encoder BM, first-stage logarithmic digital output signals $D_{q-1}\sim D_0$ are generated; a stage-potential $V_G$ of the to-be-compared voltage $U_{\alpha Z}$ is obtained by controlling a stage-potential switch JDWKG via the first-stage comparison values $I_{Q-1}\sim I_1$ or the digital output signals $D_{q-1}\sim D_0$, namely obtaining a rough result of $U_{\alpha Z}$ about a detection that to which segments of the first-stage-potential chains the to-be-compared voltage $U_{\alpha Z}$ belongs; the to-be-compared voltage $U_{\alpha Z}$ is connected to first-stage summators $\Sigma_{Q-1}\sim \Sigma_0$ to be a minuend, and the reference potential points $V_{Q-1}\sim V_\theta$ are correspondently connected to $\Sigma_{Q-1}\sim \Sigma_0$ to be subtrahends, so as to generated difference voltages $U_{X(Q-1)}\sim U_{X0}$; then, the difference voltages $U_{X(Q-1)}\sim U_{X0}$ are sent into first-stage amplifiers $F_{Q-1}\sim F_0$ to generate operational voltages $U_{y(Q-1)}\sim U_{y0}$; the difference voltage correspondent to the stage-potential $V_G$ is called a residue voltage $U_{XG}$; the operational voltage correspondent to the stage-potential $V_G$ is called an operational stage-potential $U_{yG}$; the summators acquires that the residue voltage $U_{XG}=U_{\alpha Z}-V_G$ and that $U_{XG}$ ranges within $(0\sim\Delta V_G)$, wherein $\Delta V_G$ is a quantization distance of the stage-potential; $\Delta V_G=(V_{(G+1)}-V_G)$; let an amplification coefficient of the amplifier $F_G$ be $V_P/\Delta V_G$, the amplifier $F_G$ generates the operational stage voltage $U_{yG}=U_{XG}*V_P/\Delta V_G$; after $U_{XG}$ is amplified into $U_{yG}$, the voltage range expands into a full scale of $0\sim V_P$; the stage-potential switch extracts out the operational stage voltage $U_{yG}$ and sends the extracted $U_{yG}$ into a switch main line $S_\alpha$ towards the next stage; $U_{yG}$ becomes the to-be-compared voltage at the next stage $U_{\beta Z}$ after being sampled and held by a sampler/holder $CB_\beta$, before an accurate measurement at the next stage; the input voltages of the two sub-stages maintain independent and stable within a sampling cycle due to the inter-stage sampler/holder $CB_\beta$, in such a manner that the two sub-stages are capable of parallel operating and forming a pipeline type conversion;

the second-stage $LAD\#_\beta$ mainly comprises a second-stage logarithmic chain parallelizer $LBXQ_\beta$, wherein second-stage logarithmic resistor chain $R'_T\sim R'_1$ form potential points $V_P$ and $V'_{T-1}\sim V'_0$; except $V_P$, $V'_{T-1}\sim V'_0$ are second-stage logarithmic reference potential points; $V'_{T-1}\sim V'_1$ are connected to correspondent inverting terminals of second-stage comparators $C'_{T-1}\sim C'_1$, and the second-stage to-be-compared voltage $U_{\beta Z}$ is connected to a non-inverting terminal of each second-stage comparator, so as to generate second-stage comparison values $I'_{T-1}\sim I'_1$; then the second-stage comparison values $I'_{T-1}\sim I'_1$ are encoded by a second-stage encoder BM' to generate second-stage logarithm law digital signals $D'_{t-1}\sim D'_0$; the two sub-stages, $LAD\#_\alpha$ and $LAD\#_\beta$, together accomplish the digital signals conversion of the q+t bits logarithm law, wherein $D_{q-1}\sim D_0$ are high bit and $D'_{t-1}\sim D'_0$ are low bit;

the logarithmic resistor chain is for increasing an SNR and broadening a signal dynamic range; the resistor chains of the two sub-stages, LAD#$_\alpha$ and LAD#$_\beta$ are set according to the logarithm law as follows;

the first-stage resistor chain is logarithmically provided, wherein the resistor chain of LAD#$_\alpha$ has a constant resistance, so a chain current $I_\alpha$ is also constant; let a base potential $V_\theta$ be equal to a minimum effective detection value of a sensor, and let a base resistance $R_\theta=V_\theta/I_\alpha$ and $R_A/R_\theta=\eta-1$, wherein $R_A$ is a virtual start resistance, the first-stage chain resistances successively increase by a large ratio of $\eta^T$ from $R_A$, which forms a large ratio resistor chain: $R_1=R_A*\eta^T$, $R_2=R_A*\eta^{2*T}$, ..., $R_{Q-3}=R_A*\eta^{(Q-3)*T}$, $R_{Q-2}=R_A*\eta^{(Q-2)*T}$, $R_{Q-1}=R_A*\eta^{(Q-1)*T}$; the large ratio resistor chain $R_\theta\sim R_Q$ forms a large ratio potential chain $(V_{j+1}/V_j=\eta^T)$: ground, $V_\eta$, $V_1=V_\theta*\eta^T$, $V_2=V_\theta*\eta^{2*T}$, $V_3=V_\theta*\eta^{3*T}$, ..., $V_{Q-2}=V_\theta*\eta^{(Q-2)*T}$, $V_{Q-1}=V_\theta*\eta^{(Q-1)*T}$, $V_Q=V_\theta*\eta^{Q*T}=V_P$; except point $V_Q=V_P$, totally Q reference potential points, also called quantized points, are: $V_\theta$, $V_1$, ..., $V_{Q-1}$; because a region below $V_\theta$ is an invalid detection region of the sensor, $V_\theta$ is the quantized point of the region of $(V_1\sim V_\theta\sim 0)$ which is marked as $(V_1\sim V_\theta\sim 0)\to V_\theta$; quantization intervals of the other quantized points are: $(V_2\sim V_1]\to V_1$, $(V_3\sim V_2]\to V_2$, ..., $(V_{Q-1}\sim V_{Q-2}]\to V_{Q-2}$, $(V_Q\sim V_{Q-1}]\to V_{Q-1}$; since the first-stage quantized points are rough because of the large ratio $\eta^T$, it is necessary to insert T second-stage fine quantized points having a small ratio of 71 therebetween;

the second-stage resistor chain is logarithmically provided; the resistor chain of LAD#$_\beta$ comprises $T=2^t$ resistors $R'_1\sim R'_T$; at the first stage, the residue voltage $U_{XG}=U_{\alpha Z}-V_G$ ranges within $(0\sim\Delta V_G)$; $\Delta V_G=(V_{(G+1)}-V_G)$; $V_G=V_\theta*\eta^{G*T}$, $V_{(G+1)}=V_\theta*\eta^{(G+1)*T}$, wherein $\Delta V_G$ is the quantization step of the first-stage stage-potential $V_G$; theoretically, T fine quantized points of the second sub-stage need to be inserted into $V_G\sim V_{(G+1)}$; the fine quantized points of $V_G\sim V_{(G+1)}$ comprise $V''_0=V_G=V_\theta*\eta^{G*T}$, $V''_1=V_G*\eta^1$, $V''_2=V_G*\eta^2$, $V''_3=V_G*\eta^3$, ..., $V''_{T-2}=V_G*\eta^{T-2}$, $V''_{T-1}=V_G*\eta^{T-1}$, wherein the fine quantized points increase geometrically by a ratio of $\eta$; thus, once the second-stage resistor chain has the geometrical relation of $\eta$ and is multiplied by a coefficient, the second-stage resistor chain is capable of accomplishing the logarithmic conversion of the residue voltage; actually, the second-stage conversion is extracting out the first-stage residue voltage $U_{XG}$, rather than inserting the fine quantized points into $V_G\sim V_{(G+1)}$; $U_{XG}$ ranges within $(0\sim\Delta V_G)$; the first-stage residue voltage $U_{XG}$ expands into the first-stage operational stage voltage $U_{yG}$ after being amplified by the correspondent amplifier $F_G$; let the amplification coefficient of the amplifier $F_G$ be $V_P/\Delta V_G$, $U_{yG}=U_{XG}*V_P/\Delta V_G$, and the range of $(0\sim\Delta V_G)$ is expanded into a second-stage full scale of $0\sim V_P$; the operational stage-potential $U_{yG}$ becomes the second-stage to-be-compared voltage $U_{\beta Z}$ after being sampled and held by the sampler/holder $CB_\beta$; it is a key of the second-stage resistor chain to establish the logarithm law quantized points; in the second-stage resistor chain, given that $R_B$ is an arbitrary virtual resistance, values of T chain resistors increase geometrically by the ratio of $\eta$: $R'_1=R_B*\eta^1$, $R'_2=R_B*\eta^2$, $R'_3=R_B*\eta^3$, ..., $R'_{T-2}=R_B*\eta^{T-2}$, $R'_{T-1}=R_B*\eta^{T-1}$, $R'_T=R_B*\eta^T$, and then naturally T quantized points whose potentials geometrically increase by the ratio of $\eta$ are formed: 0, $V'_1=V_B*\eta^1$, $V'_2=V_B*\eta^2$, $V'_3=V_B*\eta^3$, ..., $V'_{T-2}=V_B*\eta^{(T-2)}$, $V'_{T-1}=V_B*\eta^{(T-1)}$, as well as the quantization intervals thereof: $(V'_1\sim 0]\to 0$, $(V'_2\sim V'_1]\to V'_1$, $(V'_3\sim V'_2]\to V'_2$, ..., $(V'_{T-1}\sim V'_{T-2}]\to V'_{T-2}$, $(V'_T\sim V'^{T-1}]\to V'^{T-1}$; $V'T=V_P$ is excluded from the second-stage quantized points; and herein, the logarithmic ADC with two resistor chains of the two sub-stages convert the analog signals into the logarithmic digital signals having a constant SNR; further, if the base resistance $R_\theta$ is adjusted into an adjustment resistance $R*_\theta$, wherein $R*_\theta=R_\theta\sim R_\theta/15$, let $R*_\theta$ be the minimal effective signal of the sensor, by reducing the adjustment resistance $R*_\theta$, the SNR curve decreases at a small signal terminal, and the dynamic range expands.

7. The multi-stage parallel super-high-speed ADC and DAC of the logarithmic companding law, as recited in claim 1, wherein a two-stage logarithmic chain DAC is establish as follows; the two-stage logarithmic chain DAC comprises a resistor chain and a reference potential chain which are in a logarithmic relation; the DAC receives logarithm law digital signals comprising high bit $D_{q-1}\sim D_0$, and low bit $D'_{t-1}\sim D'_0$, wherein the high bit $D_{q-1}\sim D_0$ are correspondingly sent into control terminals $d_{q-1}\sim d_0$ of a first-stage multi-channel switch, so as to generate a first-stage stage-potential $V_G$; and the low bit $D'_{t-1}\sim D'_0$ are correspondingly sent into control terminals $d'_{t-1}\sim d'_0$ of a second-stage multi-channel switch, so as to generate a second-stage stage-potential $V'_B$; let b equal to some point within $(0\sim T-1)$, $V'_b$ is called a reference potential point at second-stage step b, wherein a strobe potential point is the second-stage stage-potential $V'_B$; the two-stage logarithmic chain DAC further comprises a lossless switch;

LDA#$_\beta$ comprises DZL$_\beta$, JDWKG' and $\Sigma_{\beta U}$; DZL$_\beta$, a second-stage logarithmic resistor chain, comprises a second-stage logarithmic resistor chain $R'_T\sim R'_1$, and second-stage logarithmic reference potential points $V'_{T-1}\sim V'_0$; the second-stage resistor chain is logarithmically provided as illustrated in Embodiment 4.1 of the present invention;

the second-stage resistor chain forms the T reference potential points $V'_{T-1}$; $V'_{T-2}$, ..., $V'_1$, $V'_0$, and quantization intervals thereof $(V'_1\sim 0]\to >V'_0$, $(V'_2\sim V'_1]\to V'_1$, $(V'_3\sim V'_2]\to V'_2$, ..., $(V'_{T-1}\sim V'_{T-2}]\to V'_{T-2}$, $(V'_T\sim V'_{T-1}]\to V'_{T-1}$; a quantization step, or a step difference, of $V'_b$ is $\Delta V'_b=V'_{b+1}-V'_b$; after the control terminals $d'_{t-1}\sim d'_0$ of the second-stage stage-potential switch JDWKG' receive the low bit digital signals $D'_{t-1}\sim D'_0$, a strobe point $S'_b$ is determined among second-stage switch points $S'_{T-1}\sim S'_0$ and specially marked as $S'_B$; the potential point $V'_b$ correspondent to the strobe point $S'_B$ is a second-stage stage-potential $V_{\beta B}$; the second-stage stage-potential $V_{\beta B}$ ranges within the T potential points $V'_0, V'_1, ..., V'_{T-2}, V'_{T-1}$ whose quantization intervals respectively are: $(V'_1\sim V'_0]\to V'_0$, $(V'_2\sim V'_1]\to V'_1$, $(V'_3\sim V'_2]\to V'_2$, ..., $(V'_{T-1}\sim V'_{T-2}]\to V'_{T-2}$, $(V'_T\sim V'_{T-1}]\to V'_{T-1}$, so an analog voltage correspondent to the second-stage stage-potential $V_{\beta B}$ ranges within $0\sim V_P$;

LDA#$_\alpha$ comprises DZL$_\alpha$, SJQH, JDWKG, and $\Sigma_{AU}$; DZL$_\alpha$, a first-stage logarithmic resistor chain, comprises a first-stage logarithmic resistor chain $R_Q\sim R_1$ and $R_\theta$, and first-stage logarithmic reference potential points $V_{Q-1}\sim V_\theta$; the first-stage resistor chain is logarithmically provided; let g be an arbitrary one of $0\sim(Q-1)$, each first-stage-potential point $V_g$ is correspondingly connected to an summator $\Sigma_g$, an attenuator $\Psi_g$ and a switch point $S_g$, so as to form a branch g; the voltage between the potential point $V_g$ and the potential point $V_{g+1}$ is called a step difference $\Delta V_g$ of the potential point $V_g$, wherein $\Delta V_g = V_{g+1} - V_g$;

the second-stage stage-potential $V_{\beta B}$ is summed with the first-stage stage-potential $V_G$ as the residue voltage of the stage-potential $V_G$; the range $0\sim V_P$ of $V_{\beta B}$ is attenuated into $0\sim\Delta V_g$ through the attenuator $\Psi_g$; because $\Delta V_g$ at each step is unequal but geometric, an attenuation coefficient $\psi_g$ of the attenuator $\Psi_g$ at each step is also geometric; let $\psi_g = \Delta V_g/V_P$, the second-stage stage-potential $V_{\beta B}$ is changed into an attenuated value $V_{\Psi g}$ based on an attenuation calculation of $V_{\Psi g} = V_{\beta B} * \psi_g = V_{\beta B} * \Delta V_g / V_P$, in such a manner that the range $0\sim V_P$ of $V_{\beta B}$ is attenuated into the range $0\sim\Delta V_g$ of $V_{\Psi g}$; the attenuated voltage $V_{\Psi g}$ is the residue voltage at step g of the first-stage reference potential points $V_{Q-1}\sim V_\theta$ before becoming the strobe potential; the first-stage reference potential $V_g$ is a rough analog value, while the correspondent attenuated voltage $V_{\Psi g}$ as the residue voltage of $V_g$ is a fine analog value; $V_g$ is summed with $V_{\Psi g}$ through the summator $\Sigma_g$, so as to generate a sum of the first-stage rough analog value $V_g$ and the second-stage fine analog value $V_{\Psi g}$; the sum thereof is called a reference potential sum value $V_{\Sigma g}$; each first-stage reference potential $V_g$ has a correspondent reference potential sum value $V_{\Sigma g}$ to be outputted; after the control terminals $d_{q-1}\sim d_0$ of the first-stage stage-potential switch JDWKG receive the high bit digital signals $D_{q-1}\sim D_0$, a first-stage strobe point $S_G$ is determined, and then the reference potential sum value $V_{\Sigma g}$ correspondent to the first-stage strobe point is outputted as a stage-potential sum value $U_{\Sigma G}$ into a collector $\Sigma_{\alpha U}$; actually, the collector $\Sigma_{\alpha U}$ only receives the single stage-potential sum value $U_{\Sigma G}$ which is outputted in a form of a DA conversion value $U_{\alpha \beta}$; herein, the two-stage logarithmic chain DAC finishes the conversion.

8. The multi-stage parallel super-high-speed ADC and DAC of the logarithmic companding law, as recited in claim 1, wherein a two-stage logarithmic chain DAC having half-step quantization points is established, and reference potential points of the DAC are the half-step quantization points; half-step reference points are formed by moving all of the reference potential points a half step up; half-step resistances are formed by moving all of the resistances the half step up; $U_g$ represents a first-stage half-step reference point; $P_g$ represents a first-stage half-step resistance; $U'_b$ represents a second-stage half-step reference point; $P'_b$ represents a second-stage half-step resistance; a correspondence between a resistor chain of the DAC having the half-step quantization points and the resistor chain of the DAC is $U_g \to V_g$, $P_g \to R_g$, $U'_b \to V'_b$, $P'_b \to *R'_b$; the half-step means moving the original reference potential points the half step up, calculated as: moving all the reference potential points the half step up generates the first-stage half-step reference point $U_g = (V_g + V_g * \eta)/2$, the first-stage half-step resistance $P_g = (R_g + R_g * \eta)/2$, the second-stage half-step reference points $U'_b = (V_b + V_b * \eta)/2$, and the second-stage half-step resistance $P'_b = (R'_b + R'_b * \eta)/2$, so as to accomplish moving all of the reference potential points and the resistance the half step up.

9. The multi-stage parallel super-high-speed ADC and DAC of the logarithmic companding law, as recited in claim 1, wherein a digital logarithmic converter is established, wherein a linear analog signal is firstly converted into an N-bit logarithm law digital signal by the two-stage N-bit logarithmic chain ADC, and then converted into an output analog signal by a N-bit linear DAC; and the output analog signal is an analog signal based on a logarithm law.

10. The multi-stage parallel super-high-speed ADC and DAC of the logarithmic companding law, as recited in claim 1, wherein a digital anti-logarithmic converter is established, wherein an analog signal based on a logarithm law is firstly converted into an N-bit logarithm law digital signal by an N-bit linear ADC, and then converted into an output analog signal by an N-bit two-stage logarithmic chain DAC; and the output analog signal is a linear analog signal.

\* \* \* \* \*